(12) United States Patent
Park et al.

(10) Patent No.: US 10,066,057 B2
(45) Date of Patent: Sep. 4, 2018

(54) ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Yu-Shin Park, Suwon-si (KR); Yun-Jun Kim, Suwon-si (KR); Tae-Ho Kim, Suwon-si (KR); You-Jung Park, Suwon-si (KR); Yoo-Jeong Choi, Suwon-si (KR); Hyo-Young Kwon, Suwon-si (KR); Seung-Hyun Kim, Suwon-si (KR); Ran Namgung, Suwon-si (KR); Dominea Rathwell, Suwon-si (KR); Soo-Hyoun Mun, Suwon-si (KR); Hyun-Ji Song, Suwon-si (KR); Hyeon-Il Jung, Suwon-si (KR); Yu-Mi Heo, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 77 days.

(21) Appl. No.: 14/954,403

(22) Filed: Nov. 30, 2015

(65) Prior Publication Data
US 2016/0297932 A1  Oct. 13, 2016

(30) Foreign Application Priority Data
Apr. 10, 2015 (KR) .......... 10-2015-0051094

(51) Int. Cl.
*C09K 13/06* (2006.01)
*C08G 73/06* (2006.01)
(Continued)

(52) U.S. Cl.
CPC ....... *C08G 73/0672* (2013.01); *G03F 7/0752* (2013.01); *G03F 7/091* (2013.01);
(Continued)

(58) Field of Classification Search
CPC ................ C08G 37/06; C08G 37/0672; C08G 73/0672; G03F 7/0752; G03F 7/40;
(Continued)

(56) References Cited

U.S. PATENT DOCUMENTS

2009/0111050 A1* 4/2009 Naiini ............... C08L 77/06
430/283.1
2012/0135348 A1* 5/2012 Shibuya ............ G03F 7/0045
430/281.1

FOREIGN PATENT DOCUMENTS

CN 103229104 A 7/2013
CN 104067175 A 9/2014
(Continued)

OTHER PUBLICATIONS

Taiwanese Search Report dated Jun. 23, 2016 in Corresponding Taiwanese Patent Application No. 104140872.
(Continued)

*Primary Examiner* — Lan Vinh
(74) *Attorney, Agent, or Firm* — Lee & Morse, P.C.

(57) ABSTRACT

An organic layer composition, an organic layer, and associated methods, the composition including a polymer that includes a moiety represented by Chemical Formula 1, a monomer represented by Chemical Formula 2, and a solvent,

[Chemical Formula 1]

(Continued)

[Calculation Equation 1]

-continued

[Chemical Formula 2]

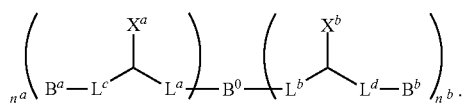

20 Claims, 1 Drawing Sheet

(51) Int. Cl.
*G03F 7/075* (2006.01)
*G03F 7/09* (2006.01)
*G03F 7/004* (2006.01)
*H01L 51/00* (2006.01)

(52) U.S. Cl.
CPC .......... *G03F 7/094* (2013.01); *G03F 7/0041* (2013.01); *H01L 51/0018* (2013.01)

(58) Field of Classification Search
CPC ..... G03F 7/11; G03F 7/20; G03F 7/32; G03F 7/0041; G03F 7/094; G03F 7/091; H01L 21/312; H01L 51/0018
USPC ............ 252/79.1, 79.2, 79.3, 79.4; 430/270, 430/281.1, 322, 325; 438/717, 725
See application file for complete search history.

(56) References Cited

FOREIGN PATENT DOCUMENTS

| | | | |
|---|---|---|---|
| CN | 104185816 | A | 12/2014 |
| CN | 104253024 | A | 12/2014 |
| JP | 2008-152203 | A | 7/2008 |
| JP | 5067537 | B2 | 11/2012 |
| JP | 5099381 | B2 | 12/2012 |
| JP | 5229044 | B2 | 7/2013 |
| JP | 2014-029435 | A | 2/2014 |
| JP | 5641253 | B2 | 12/2014 |
| KR | 10-2014-0144207 | A | 12/2012 |
| KR | 10-2014-0069163 | A | 6/2013 |
| KR | 10-2014-0117769 | A | 10/2014 |
| KR | 10-2015-0001445 | A | 1/2015 |
| KR | 10-2015-0001446 | A | 1/2015 |
| KR | 10-2015-0002928 | A | 1/2015 |
| KR | 10-2015-0002930 | A | 1/2015 |
| TW | 201319755 | A1 | 5/2013 |
| TW | 201407290 | A | 2/2014 |
| WO | WO 2012-077640 | A | 6/2012 |

OTHER PUBLICATIONS

Provisional double patenting rejection over claims of the above-identified application; USPTO Office action dated Oct. 20, 2017, in U.S. Appl. No. 14/258,489.

Chinese Search Report dated Oct. 11, 2017, with regard to the corresponding Chinese Patent Application No. 201510919487.8.

* cited by examiner

[Calculation Equation 1]

ORGANIC LAYER COMPOSITION, ORGANIC LAYER, AND METHOD OF FORMING PATTERNS

CROSS-REFERENCE TO RELATED APPLICATION

Korean Patent Application No. 10-2015-0051094, filed on Apr. 10, 2015, in the Korean Intellectual Property Office, and entitled: "Organic Layer Composition, Organic Layer, and Method of Forming Patterns," is incorporated by reference herein in its entirety.

BACKGROUND

1. Field

Embodiments relate to an organic layer composition, an organic layer manufactured from the organic layer composition, and a method of forming patterns using the organic layer composition.

2. Description of the Related Art

Recently, the semiconductor industry has developed to an ultra-fine technique having a pattern of several to several tens of nanometers in size. Such ultrafine technique essentially needs effective lithographic techniques.

SUMMARY

Embodiments are directed to an organic layer composition, an organic layer manufactured from the organic layer composition, and a method of forming patterns using the organic layer composition.

The embodiments may be realized by providing an organic layer composition including a polymer that includes a moiety represented by Chemical Formula 1, a monomer represented by Chemical Formula 2, and a solvent,

[Chemical Formula 1]

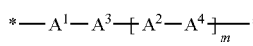

wherein, in Chemical Formula 1, $A^1$ and $A^2$ are each independently a divalent group of a compound listed in Group 1, $A^3$ and $A^4$ are each independently a cyclic group including at least one substituted or unsubstituted benzene ring, m is 0 or 1, and "*" is a linking point,

[Group 1]

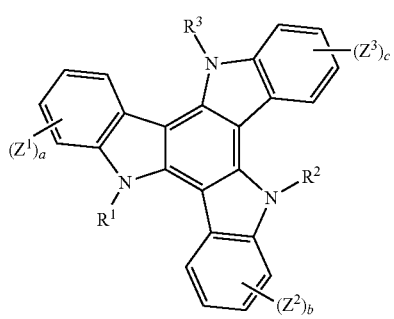

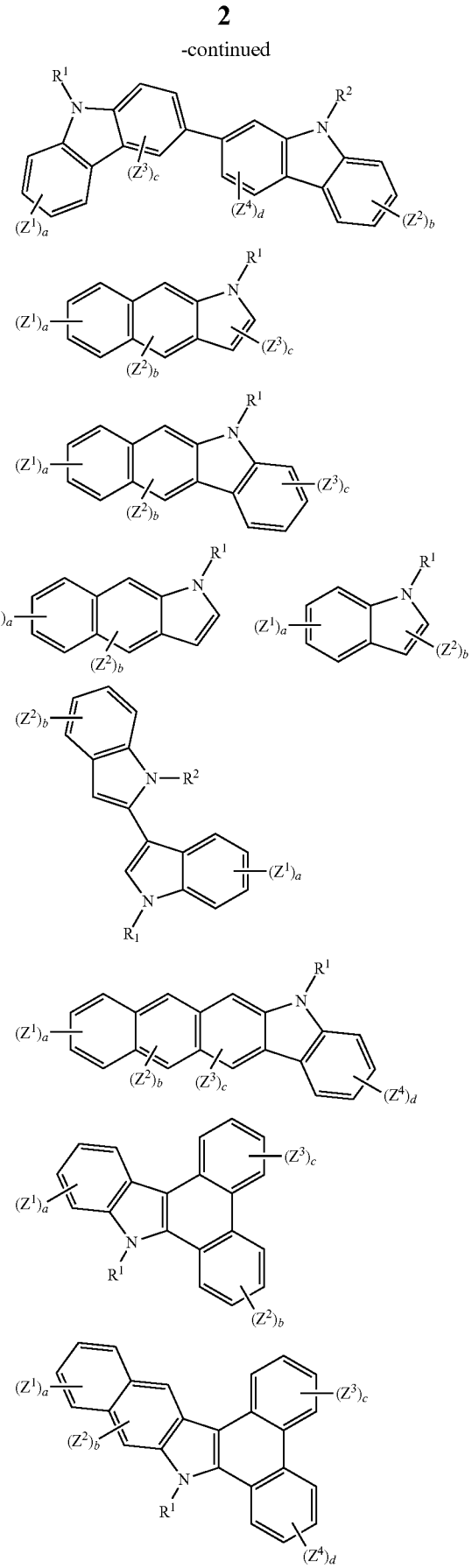

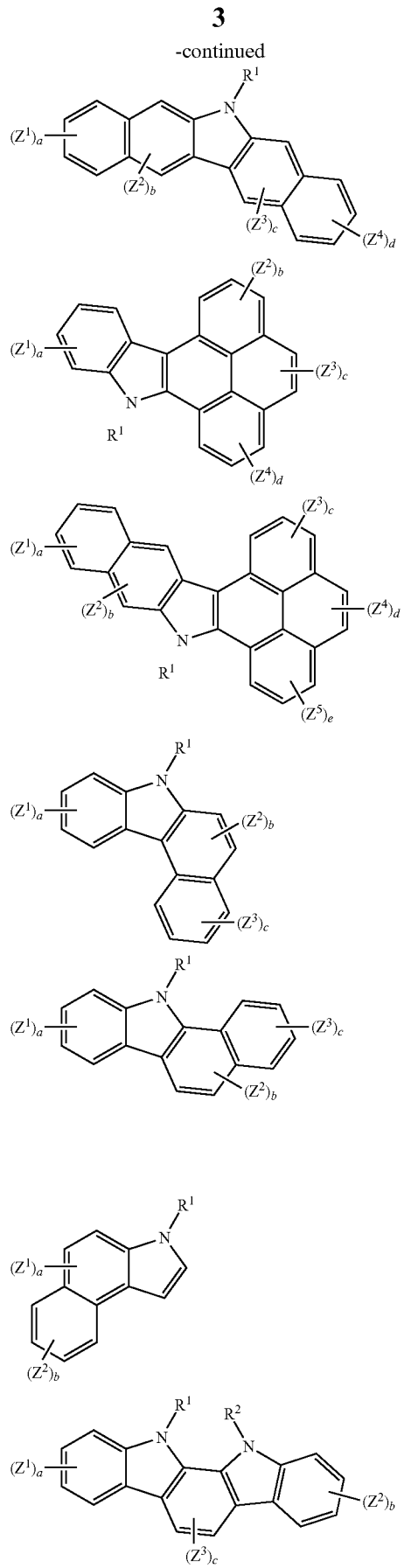
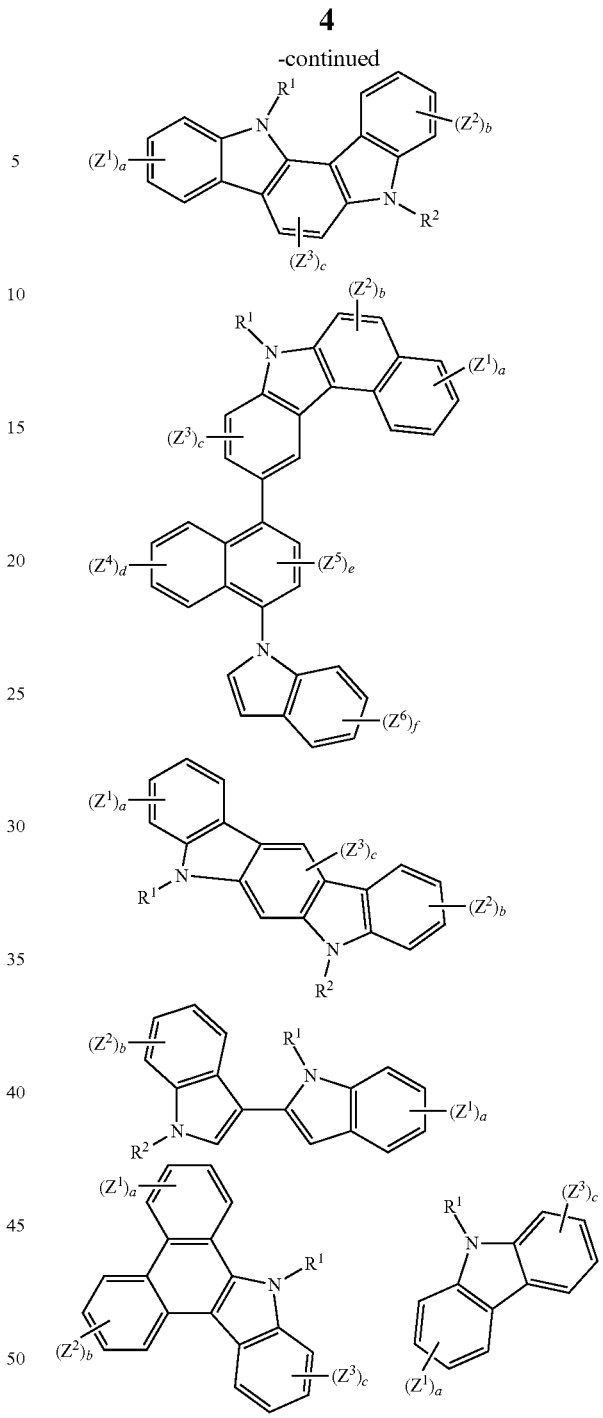

wherein, in Group 1, $R^1$, $R^2$, and $R^3$ are each independently hydrogen, a hydroxy group, a methoxy group, an ethoxy group, a halogen, a substituted or unsubstituted C6 to C30 aryl group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2,

[Chemical Formula 2]

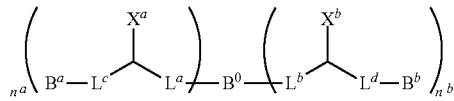

wherein, in Chemical Formula 2, $B^0$ is a substituted or unsubstituted C3 to C60 cyclic group, a substituted or unsubstituted C1 to C20 alkylene group, a substituted or unsubstituted C2 to C20 alkenylene group, a substituted or unsubstituted C2 to C20 alkynylene group, or a combination thereof, $B^a$ and $B^b$ are each independently substituted or unsubstituted C3 to C60 cyclic group, $X^a$ and $X^b$ are each independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, $L^a$, $L^b$, $L^c$, and $L^d$ are each independently a single bond, a substituted or unsubstituted C1 to C6 alkylene group, a substituted or unsubstituted C6 to C30 arylene group, or a combination thereof, and $n^a$ and $n^b$ are each independently an integer of 1 to 6, provided that $n^a+n^b \leq$ a maximum number of substituents of $B^0$.

In Chemical Formula 1, $A^3$ and $A^4$ may each independently be one of the following groups:

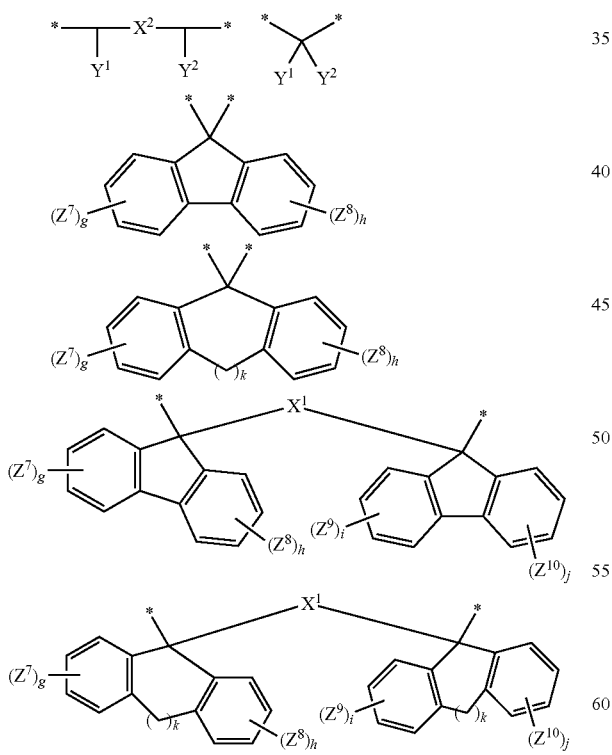

wherein, in the above groups, $X^1$ and $X^2$ may each independently be a substituted or unsubstituted C6 to C50 arylene group, a substituted or unsubstituted C1 to C10 alkyleneoxide-containing group, or a combination thereof, $Y^1$ and $Y^2$ may each independently be substituted or unsubstituted C6 to C30 aryl group, $Z^7$ to $Z^{10}$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, g, h, i, and j may each independently be an integer of 0 to 2, k may be an integer of 1 to 3, and "*" is a linking point.

$X^1$ and $X^2$ may each independently be a substituted or unsubstituted C6 to C50 arylene group, the C6 to C50 arylene group being a divalent group of one of the following compounds:

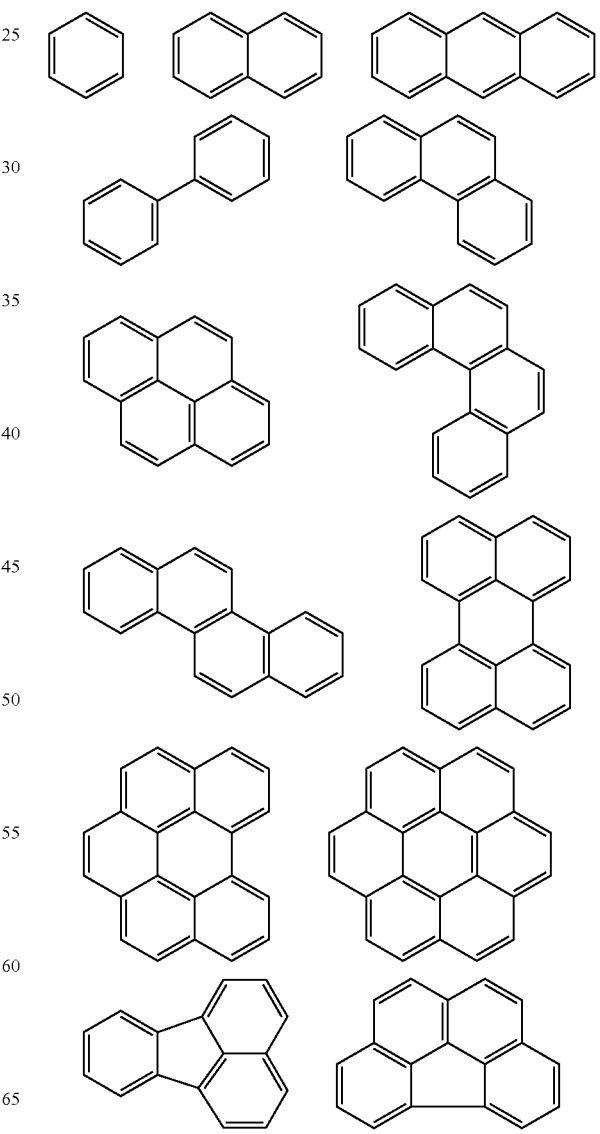

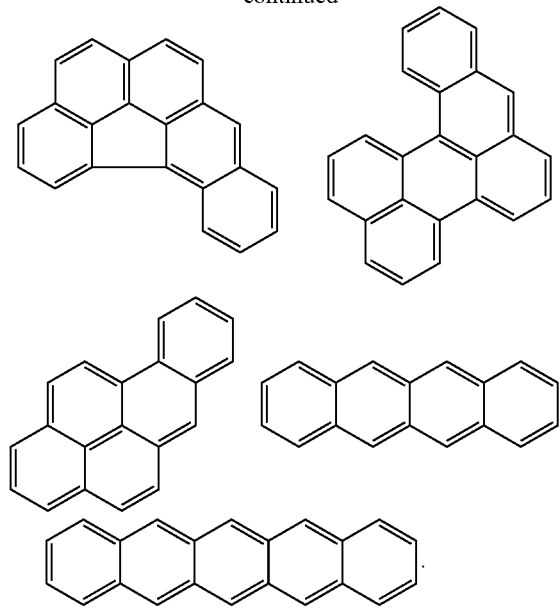

$Y^1$ and $Y^2$ may each independently be a substituted or unsubstituted C6 to C30 aryl group, the C6 to C30 aryl group being a monovalent group of one of the following compounds:

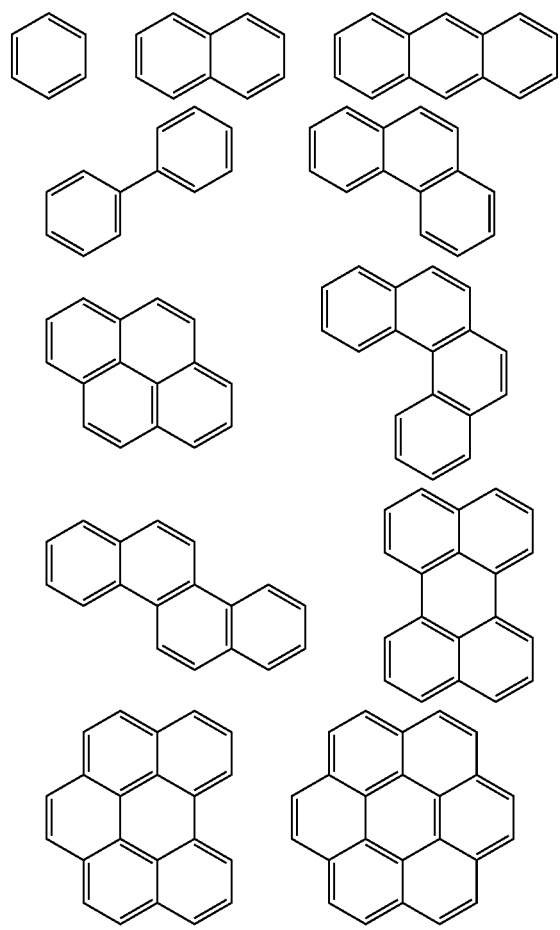

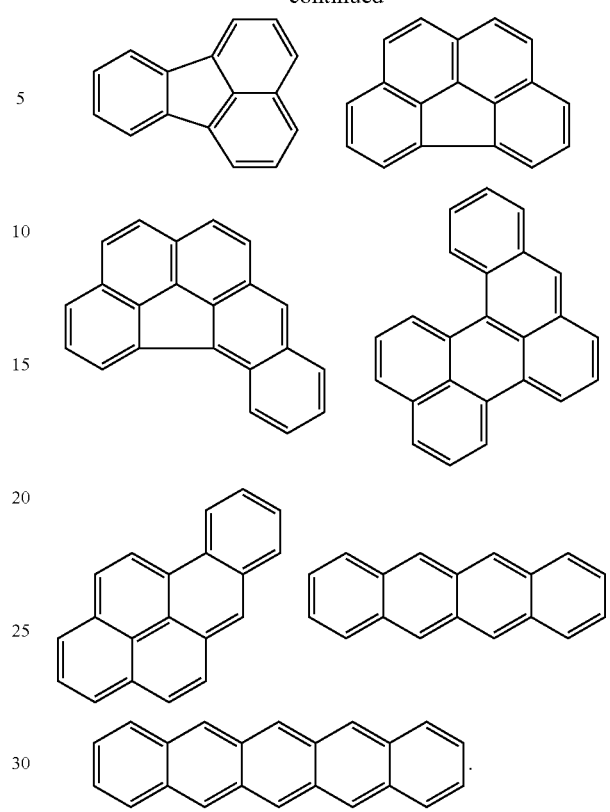

In Group 1, $R^1$, $R^2$, and $R^3$ may each independently be hydrogen or a substituted or unsubstituted phenyl group.

In Chemical Formula 2, the cyclic group of $B^0$, $B^a$, or $B^b$ may be a group of one of the following compounds:

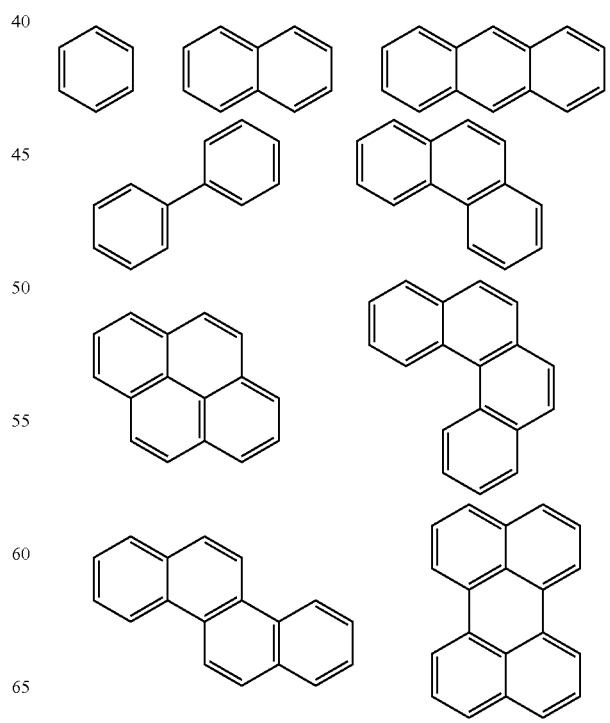

-continued

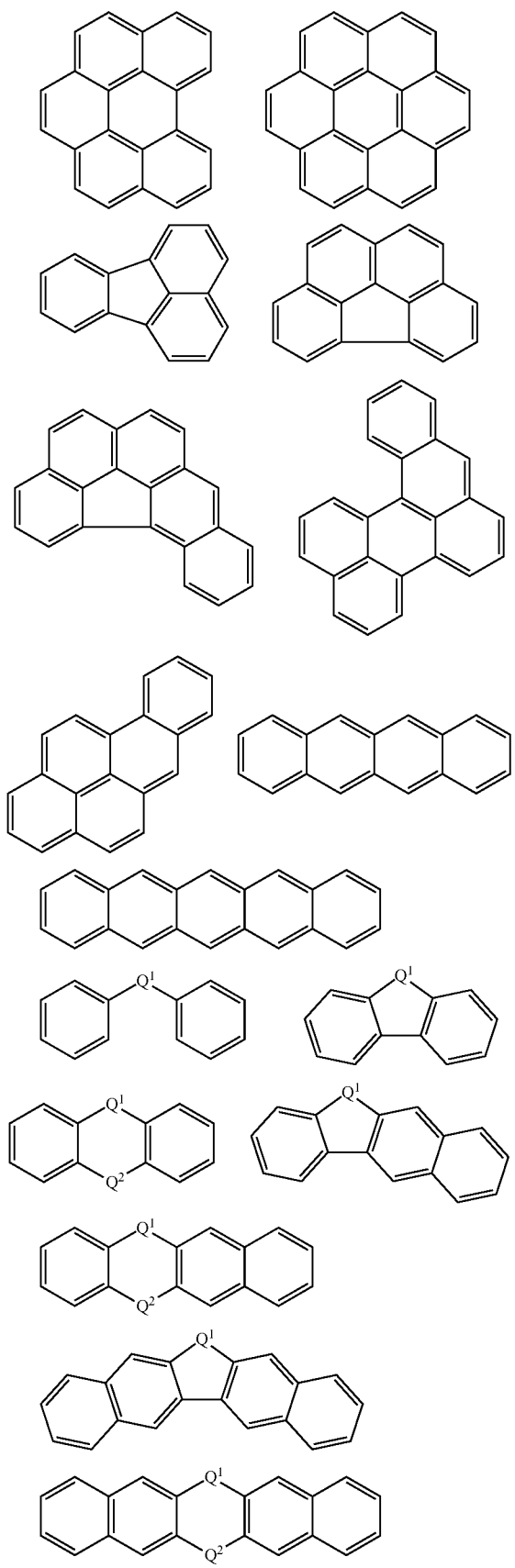

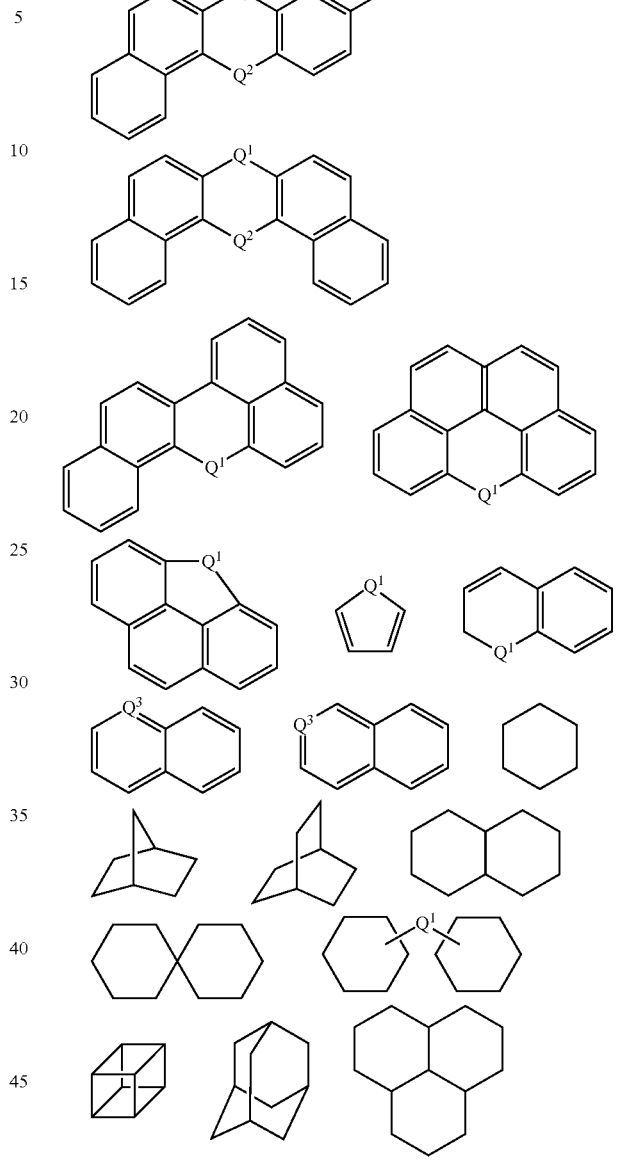

wherein, in the above compounds, $Q^1$ and $Q^2$ may each independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, and $Q^3$ may be nitrogen (N), $CR^b$, or a combination thereof, wherein $R^a$ and $R^b$ may each independently be hydrogen, a substituted or unsubstituted C1 to C10 alkyl group, a halogen atom, a halogen-containing group, or a combination thereof.

In Chemical Formula 2, at least one of $B^0$, $B^a$, and $B^b$ may be a substituted or unsubstituted polycyclic group.

In Chemical Formula 2, at least one of $B^0$, $B^a$, and $B^b$ may be a substituted or unsubstituted polycyclic aromatic group.

In Chemical Formula 2, $n^a+n^b$ may be 2 or 3.

The polymer that includes a moiety represented by Chemical Formula 1 may include a moiety represented by one of the following Chemical Formulae 1-1 to 1-3:

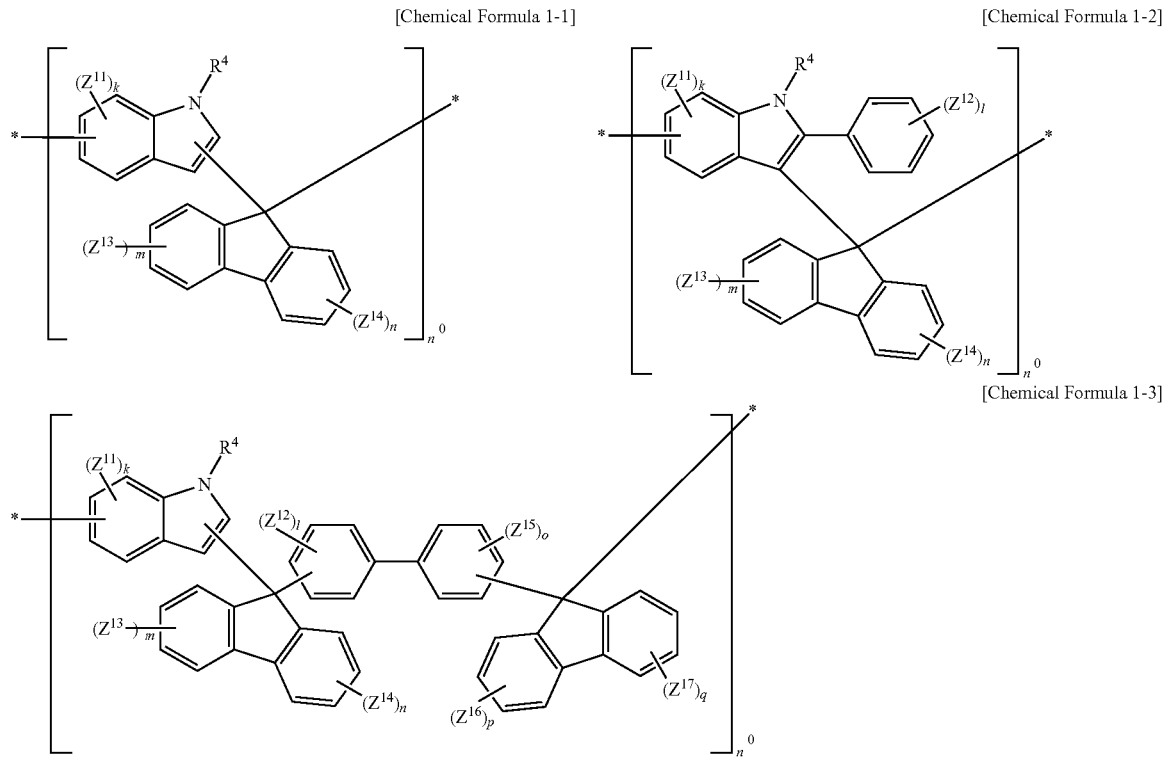

wherein, in Chemical Formulae 1-1 to 1-3, $R^4$ may be hydrogen, a hydroxy group, a halogen, a substituted or unsubstituted C6 to C30 aryl group, or a combination thereof, $Z^{11}$ to $Z^{17}$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, and q may each independently be an integer of 0 to 2, $n^o$ may be an integer of 2 to 300, and * may be a linking point.

The monomer represented by Chemical Formula 2 may be represented by one of the following Chemical Formulae 2-1 to 2-7:

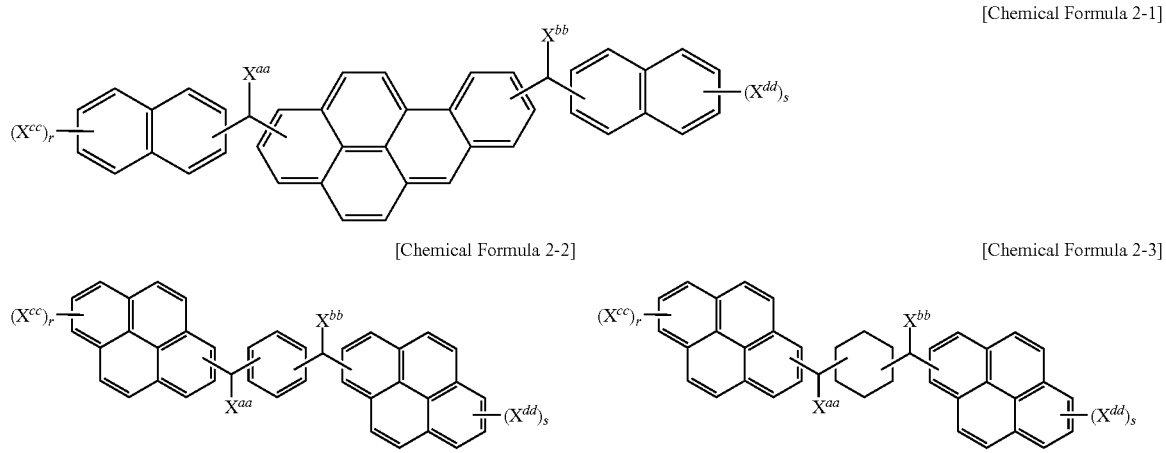

-continued

[Chemical Formula 2-4]

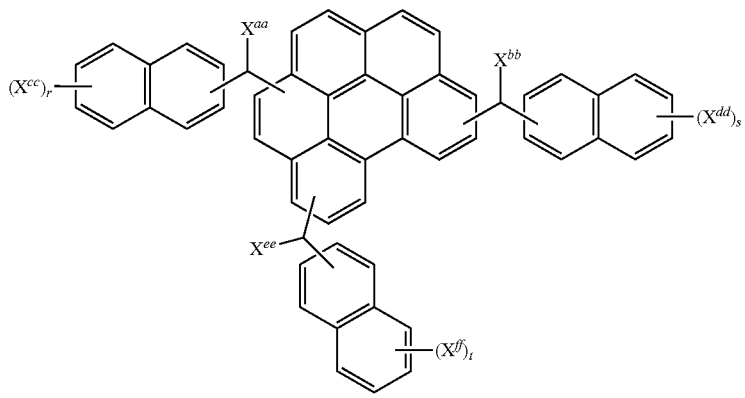

[Chemical Formula 2-5]

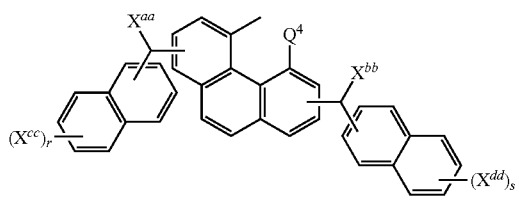

[Chemical Formula 2-6]

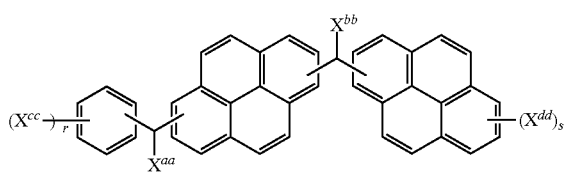

[Chemical Formula 2-7]

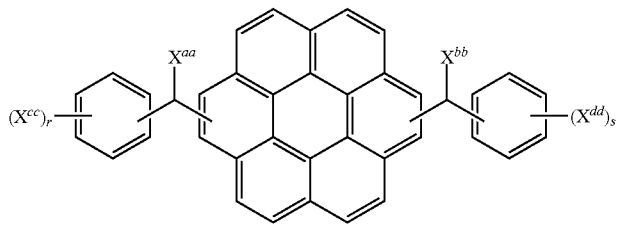

wherein, in Chemical Formulae 2-1 to 2-7, $X^{aa}$ to $X^{ff}$ may each independently be a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, r, s, and t may each independently be an integer of 0 to 2, and $Q^4$ may be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, in which $R^a$ is hydrogen, a substituted or unsubstituted C1 to C10 alkyl group, a halogen atom, a halogen-containing group, or a combination thereof.

The polymer may have weight average molecular weight of about 1,000 to about 200,000.

The monomer may have a molecular weight of about 200 to about 5,000.

The polymer and the monomer may be included in the composition in a weight ratio of about 9:1 to about 1:9.

The polymer and the monomer may be included in the composition in an amount of about 0.1 to about 50 wt %, based on a total weight of the organic layer composition.

The embodiments may be realized by providing an organic layer obtained by curing the organic layer composition according to an embodiment.

The organic layer may include a hardmask layer.

The embodiments may be realized by providing a method of forming patterns, the method including providing a material layer on a substrate, applying the organic layer composition according to an embodiment on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The method may further include forming a bottom anti-reflective coating before forming the photoresist layer.

BRIEF DESCRIPTION OF THE DRAWING

Features will be apparent to those of skill in the art by describing in detail exemplary embodiments with reference to the attached drawings in which:

FIG. 1 illustrates Calculation Equation 1 for evaluating planarization characteristics of hardmask layers.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening elements may also be present.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, C6 to C15 cycloalkynyl group, a C2 to C30 heterocycloalkyl group, and a combination thereof.

As used herein, when a definition is not otherwise provided, the term 'hetero' refers to one including 1 to 3 heteroatoms selected from B, N, O, S, and P.

As used herein, when a definition is not otherwise provided, '*' indicates a linking point of a compound or a moiety of a compound, e.g., to an adjacent group or atom.

In addition, a monovalent group derived from or of an A compound refers to a monovalent group substituting or removing one hydrogen in the A compound. For example, a monovalent group derived from or of a benzene group may be or become a phenyl group. A divalent group derived from or of an A compound refers to a divalent group substituting or removing two hydrogen to form two linking points in the A compound. For example, a divalent group derived from or of a benzene group may be or become a phenylene group.

Hereinafter, an organic layer composition according to one embodiment is described.

An organic layer composition according to an embodiment may include a polymer that includes a moiety represented by Chemical Formula 1, a compound or monomer represented by Chemical Formula 2, and a solvent.

[Chemical Formula 1]

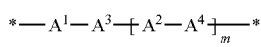

In Chemical Formula 1, $A^1$ and $A^2$ may each independently be, e.g., a divalent group of or derived from a compound listed in Group 1, below.

$A^3$ and $A^4$ may each independently be, e.g., a cyclic group including at least one substituted or unsubstituted benzene ring.

m may be 0 or 1, and

"*" is a linking point.

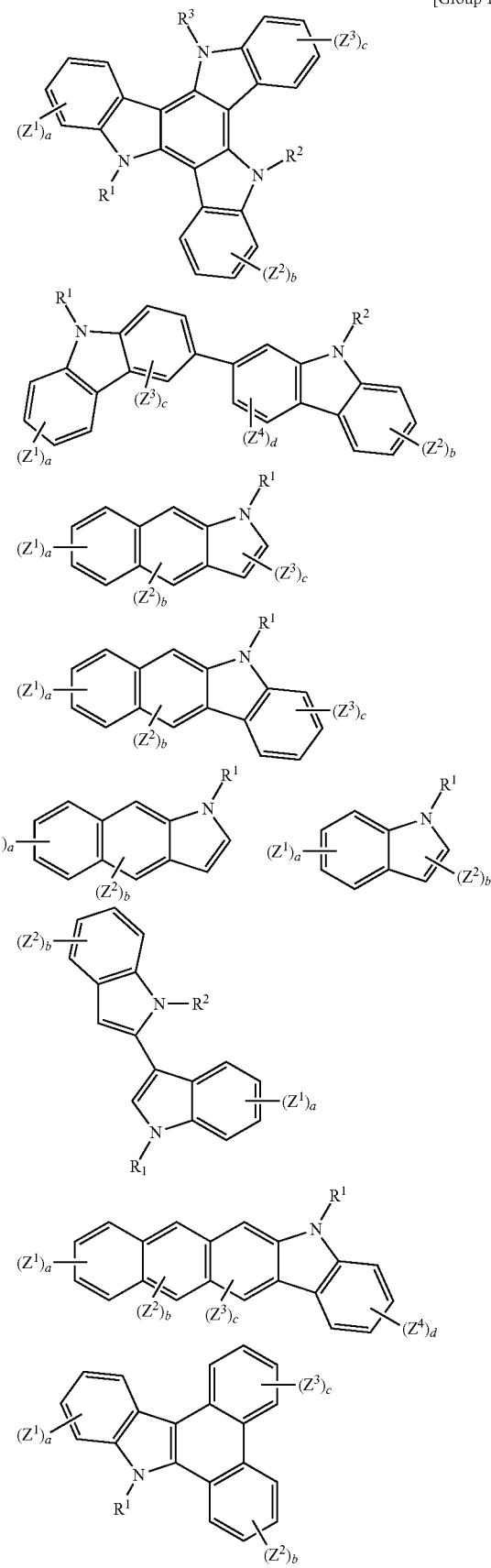

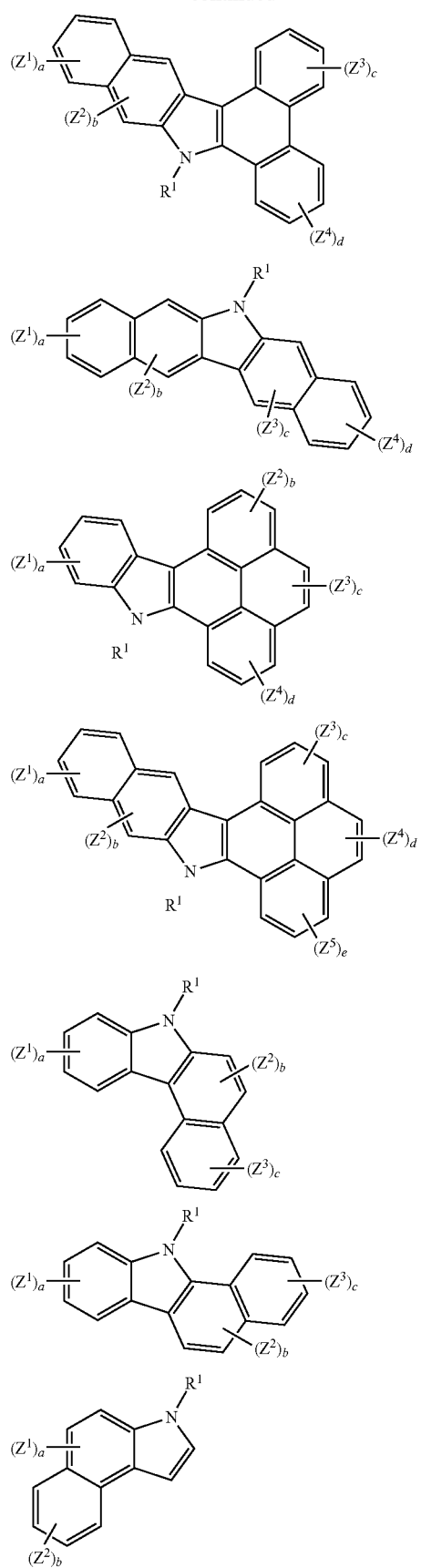
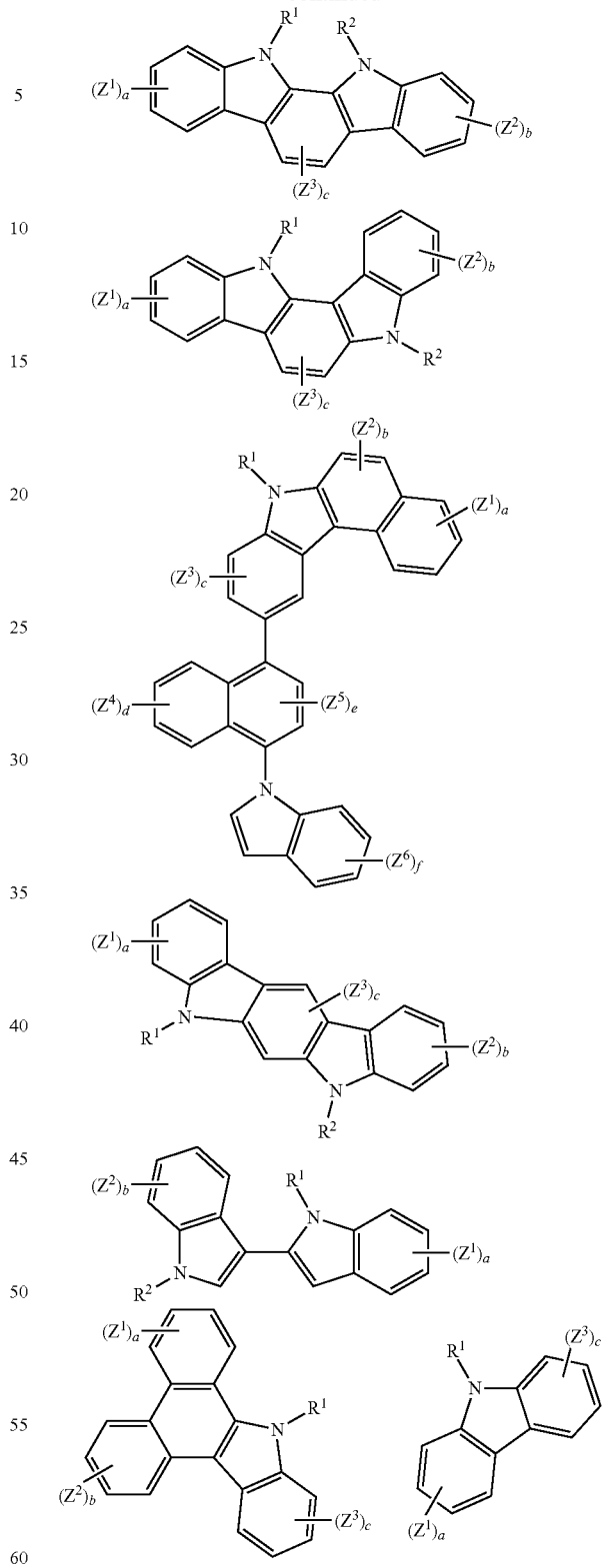
In Group 1,
R¹, R², and R³ may each independently be or include, e.g., hydrogen, a hydroxy group, a methoxy group, an ethoxy group, a halogen, a substituted or unsubstituted C6 to C30 aryl group, or a combination thereof.

$Z^1$ to $Z^6$ may each independently be or include, e.g., a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

a, b, c, d, e, and f may each independently be, e.g., an integer of 0 to 2.

In Group 1, a linking point of each compound is not particularly limited.

[Chemical Formula 2]

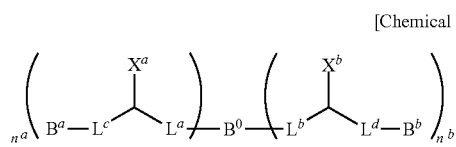

In Chemical Formula 2, $B^0$ may be or may include, e.g., a substituted or unsubstituted C3 to C60 cyclic group, a substituted or unsubstituted C1 to C20 alkylene group, a substituted or unsubstituted C2 to C20 alkenylene group, or a substituted or unsubstituted C2 to C20 alkynylene group.

$B^a$ and $B^b$ may each independently be or include, e.g., substituted or unsubstituted C3 to C60 cyclic group.

$X^a$ and $X^b$ may each independently be or include, e.g., a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

$L^a$, $L^b$, $L^c$ and $L^d$ may each independently be or include, e.g., a single bond, a substituted or unsubstituted C1 to C6 alkylene group, a substituted or unsubstituted C6 to C30 arylene group, or a combination thereof.

$n^a$ and $n^b$ may each independently be an integer of 1 to 6. In an implementation, $n^a + n^b \le$ (a maximum number of substituents of $B^0$).

The organic layer composition may simultaneously include the polymer represented by Chemical Formula 1 and the monomer represented by Chemical Formula 2.

First, the polymer is described.

The polymer may have a structure in which benzylic hydrogen is minimized, while a ring parameter is maximized. For example, an organic layer composition including the polymer may exhibit excellent etch resistance.

The polymer may include a plurality of moieties represented by Chemical Formula 1, and the plurality of moieties represented by Chemical Formula 1 may have the same or a different structure one another.

$R^1$, $R^2$ and $R^3$ (indicating a functional group bonded to a nitrogen (N) atom in Chemical Formula 1) may each independently be or include, e.g., hydrogen or a substituted or unsubstituted phenyl group.

$A^3$ and $A^4$ in Chemical Formula 1 may each independently be or include, e.g., a cyclic group including greater than or equal to one (e.g., two) benzene rings. For example, $A^3$ and $A^4$ may each independently be one of the following groups.

[Group 2]

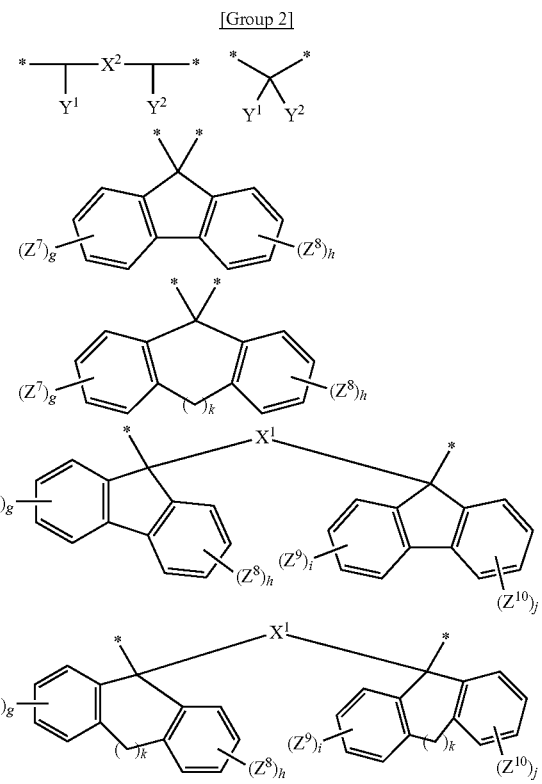

In the groups illustrated above (e.g., of $A^3$ and $A^4$), $X^1$ and $X^2$ may each independently be or include, e.g., a substituted or unsubstituted C6 to C50 arylene group, a substituted or unsubstituted C1 to C10 alkyleneoxide-containing group, or a combination thereof.

$Y^1$ and $Y^2$ may each independently be or include, e.g., a substituted or unsubstituted C6 to C30 aryl group.

$Z^7$ to $Z^{10}$ may each independently be or include, e.g., a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

g, h, i and j may each independently be an integer of 0 to 2, k is an integer of 1 to 3, and "*" is a linking point.

The polymer may include at least one of a tertiary carbon and/or a quaternary carbon in its monomer or backbone structure. In the present specification, the tertiary carbon is carbon in which three hydrogens of four hydrogens bonded thereto are substituted with other groups except for the hydrogen, and the quaternary carbon is carbon in which all four hydrogens bonded thereto are substituted with other groups except for the hydrogen. For example, the tertiary carbon may not necessarily be bonded to three other carbon atoms, and the quaternary carbon may not necessarily be bonded to four other carbon atoms.

When a polymer including the tertiary and/or quaternary carbons is used for an organic layer composition, dissolution (e.g., solubility) of a hardmask layer may be improved. Thus, the organic layer composition may be suitable for a spin-on coating method. A moiety including the tertiary carbon or the quaternary carbon is shown above in the description of the groups for $A^3$ and $A^4$.

In an implementation, $X^1$ and $X^2$ in the groups for $A^3$ and $A^4$ may each independently be or include, e.g., a substituted or unsubstituted C6 to C50 arylene group. In an implementation, the C6 to C50 arylene group may be a divalent group derived from or of one of the following compounds.

[Group 3]

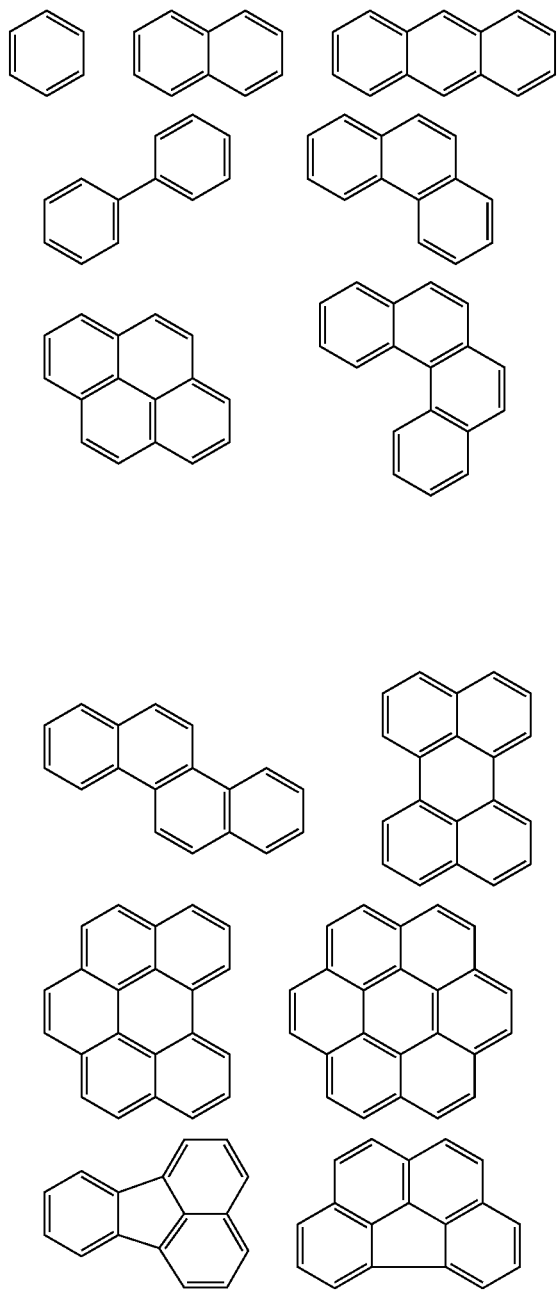

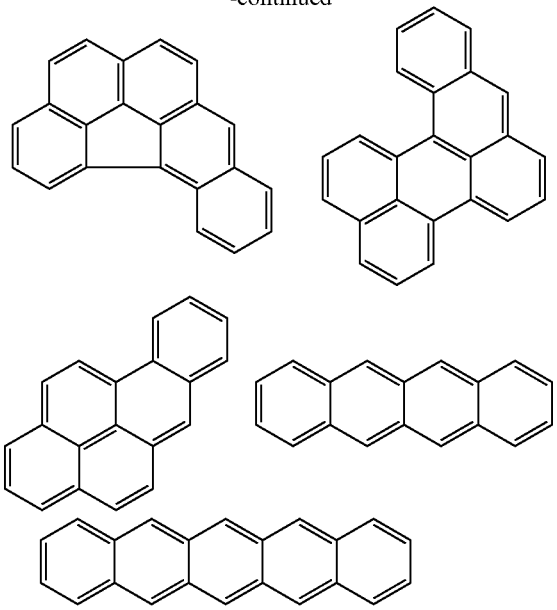

In the compounds above, a linking point of each cyclic group has no particular limit.

In an implementation, in the groups for $A^3$ and $A^4$, $Y^1$ and $Y^2$ may each independently be or include, e.g., a substituted or unsubstituted C6 to C30 aryl group. In an implementation, the C6 to C30 aryl group may be a monovalent group derived from the compounds listed above (e.g., in Group 3).

In an implementation, in the groups for $A^3$ and $A^4$, when $X^1$, $X^2$, $Y^1$ and $Y^2$ are a group derived from the compounds listed above (e.g., in Group 3), a substituent other than hydrogen may be substituted for at least one hydrogen. In an implementation, the substituent may be, e.g., a hydroxy group, a methoxy group, an ethoxy group, a C1 to C10 alkyl group, a C6 to C30 aryl group, or a combination thereof. A number and kind of the substituent may be selected depending on desired properties.

Hereinafter, a monomer or other compound included in the organic layer composition is illustrated.

The monomer may be represented by Chemical Formula 2. In an implementation, the organic layer composition may include at least one monomer represented by Chemical Formula 2.

The monomer may have a core and at least two substituents.

In Chemical Formula 2, $n^a$ and $n^b$ (indicating the number of the substituents) may each independently be an integer of about 1 to 6. In an implementation, the $n^a$ and the $n^b$ may be appropriately selected, and the sum of the $n^a$ and the $n^b$ may not be greater the maximum number of substituents of $B^0$. For example, $n^a$ and the $n^b$ may each independently be 2 or 3.

As for the monomer, a substituted or unsubstituted C3 to C60 cyclic group, a substituted or unsubstituted C1 to C20 alkylene group, a substituted or unsubstituted C2 to C20 alkenylene group, a substituted or unsubstituted C2 to C20 alkynylene group, or a combination thereof may be positioned at or as a core moiety marked as $B^0$, and a substituted or unsubstituted C3 to C60 cyclic group may be positioned at a substituent moiety. For example, when the core of the monomer is the substituted or unsubstituted C3 to C60 cyclic group, the cyclic group may be a multivalent group of one of the compounds listed in Group 3, above. In an implementation, when the core of the monomer is the substituted or unsubstituted C3 to C60 cyclic group, the cyclic group may include a group of one of the compounds compound in Groups 4 and 5, below.

[Group 4]

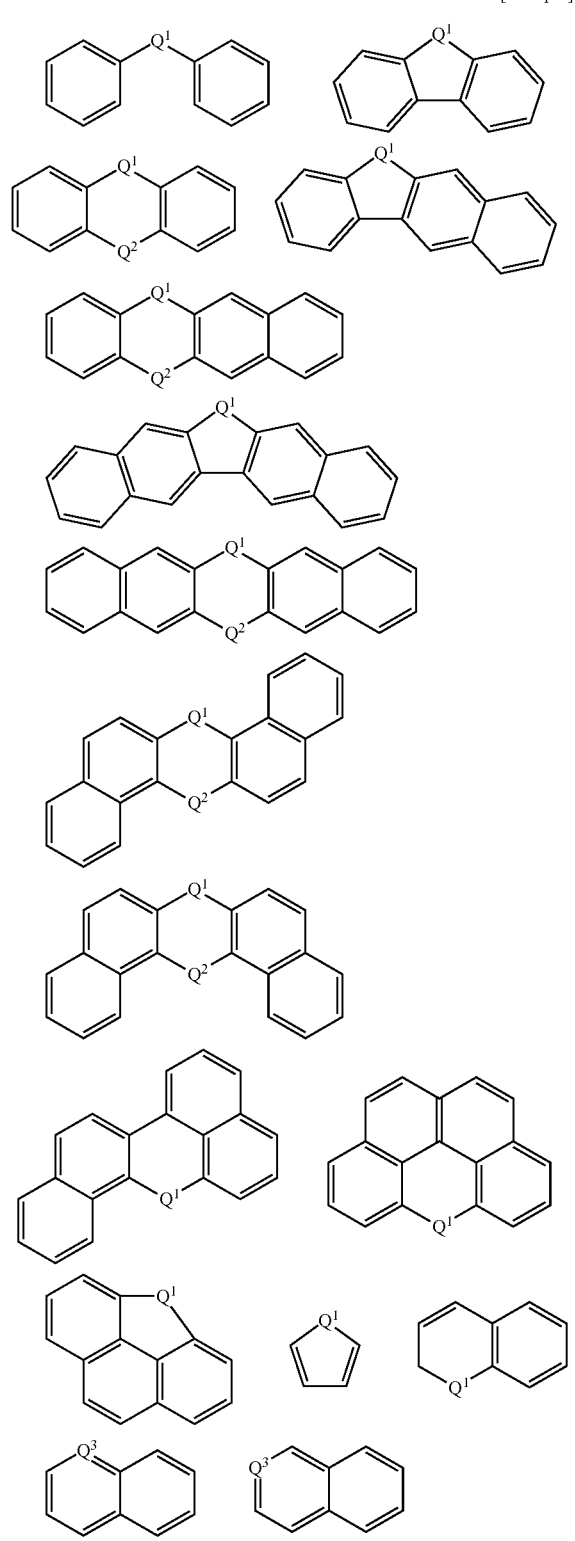

-continued

[Group 5]

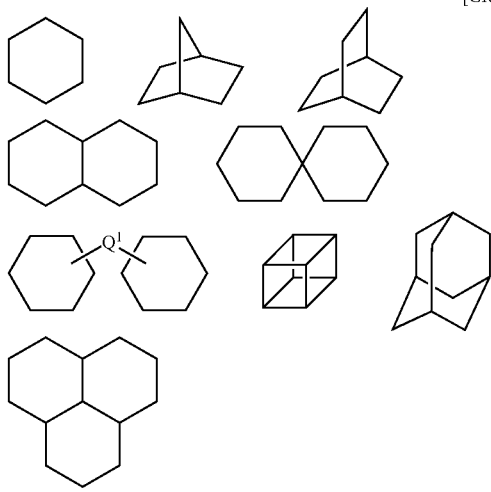

In Groups 4 and 5, $Q^1$ and $Q^2$ may each independently be or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof.

$Q^3$ may be, e.g., nitrogen (N), $CR^b$, or a combination thereof.

In an implementation, $R^a$ and $R^b$ may each independently be or include, e.g., hydrogen, a substituted or unsubstituted C1 to C10 alkyl group, a halogen atom, a halogen-containing group, or a combination thereof.

In an implementation, the cyclic groups listed in the groups 3 to 5 may be in an unsubstituted or substituted state. For example, at least one hydrogen may be substituted or replaced by a substituent like a hydroxy group, an alkoxy group, or the like. In an implementation, the cyclic groups of the compounds of groups 3 to 5 may be linked or bonded at a suitable location or linking point.

In an implementation, substituents expressed as $B^a$ and $B^b$ in Chemical Formula 2 may each independently be or include, e.g., a substituted or unsubstituted C3 to C60 cyclic group. In an implementation, the cyclic group may include groups of the compounds listed in Groups 3 to 5, above.

In an implementation, at least one of $B^0$, $B^a$ and $B^b$ in Chemical Formula 2 may be or include, e.g., a substituted or unsubstituted polycyclic cyclic group. For example, the monomer may include at least one substituted or unsubstituted polycyclic cyclic group in its structure. In an implementation, the polycyclic cyclic group may be, e.g., a polycyclic aromatic ring group. The monomer may include the polycyclic cyclic group and thus, may further secure rigid characteristics.

In an implementation, the $B^a$ or $B^b$ in Chemical Formula 1 may have a substituent substituted for or replacing at least one hydrogen. In an implementation, the substituent may be or may include, e.g., a hydroxy group, a methoxy group, an ethoxy group, a C1 to C10 alkyl group, a C6 to C30 aryl group, a C1 to C30 alkoxy group, or a combination thereof. A number and the kinds of the substituent may be selected depending on desired properties.

In an implementation, the monomer may include a functional group ($X^a$ and $X^b$) as a substituent. For example, solubility may be improved due to the presence of these functional groups. In an implementation, an organic layer may be effectively formed in a spin-on coating method. In addition, when the organic layer is formed using the spin-on coating method on a lower layer having a predetermined pattern, the organic layer composition may fill a gap among patterns. For example, gap-fill characteristics and planarization characteristics may also be improved.

In an implementation, the functional groups, $X^a$ and $X^b$, may be, e.g., hydroxy groups.

The organic layer composition may include a polymer having a structure of tertiary carbon and/or quaternary carbon and thus, may exhibit excellent solubility, even though the ring parameter of the polymer may be larger. The organic layer composition may include a monomer having at least one carbon cyclic group and may exhibit rigid characteristics.

In addition, the organic layer composition may simultaneously include the monomer along with the polymer, and the monomer may fill a void volume among the polymers which may be generated by tertiary carbon and/or quaternary carbon of the polymers. Thus, mechanical properties and etch resistance may be further improved.

In an implementation, the polymer (including the moiety represented by Chemical Formula 1) may include a moiety or repeating unit represented by one of the following Chemical Formulae 1-1 to 1-3.

In Chemical Formulae 1-1 to 1-3, $R^4$ may be or may include, e.g., hydrogen, a hydroxy group, a halogen, a substituted or unsubstituted C6 to C30 aryl group, or a combination thereof.

$Z^{11}$ to $Z^{17}$ may each independently be or include, e.g., a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

k, l, m, n, o, p and q may each independently be, e.g., an integer of 0 to 2, $n^o$ may be an integer of 2 to 300, and

* is a linking point.

In an implementation, the monomer represented by Chemical Formula 2 may be represented by one of the following Chemical Formulae 2-1 to 2-7.

[Chemical Formula 1-1]

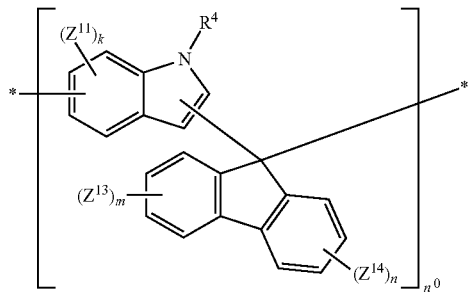

[Chemical Formula 1-2]

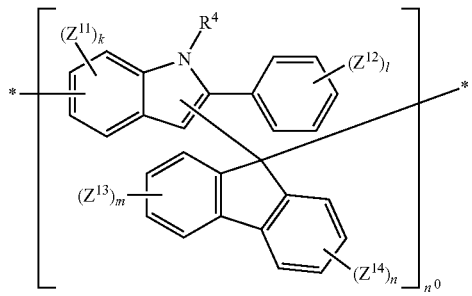

[Chemical Formula 1-3]

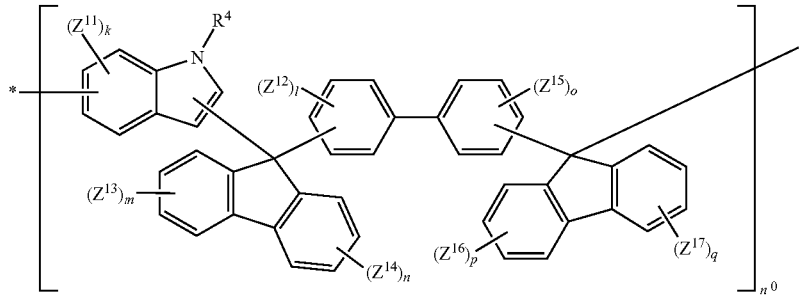

[Chemical Formula 2-1]

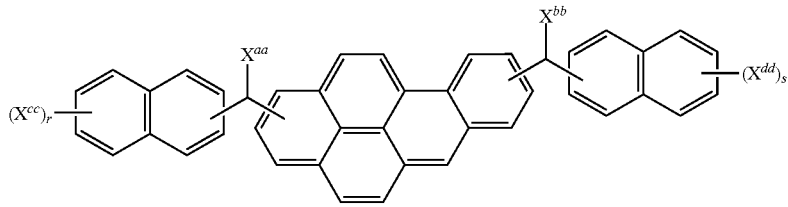

[Chemical Formula 2-2]

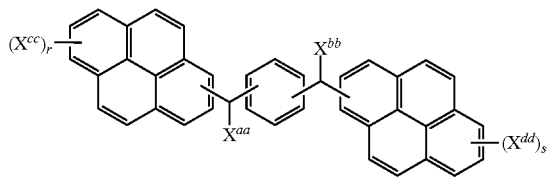

[Chemical Formula 2-3]

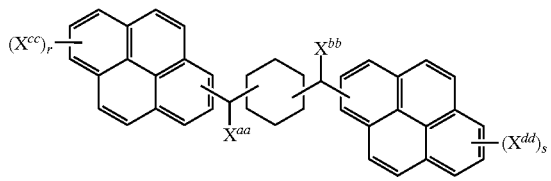

[Chemical Formula 2-4]

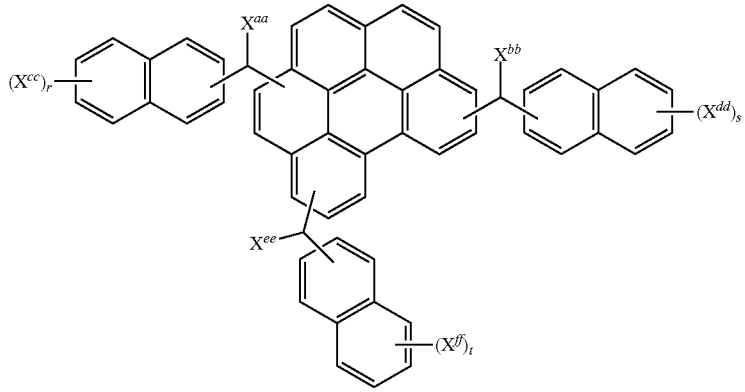

[Chemical Formula 2-5]

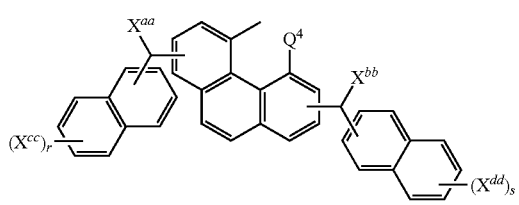

[Chemical Formula 2-6]

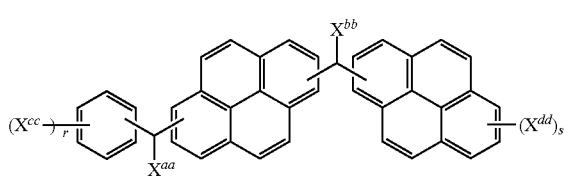

[Chemical Formula 2-7]

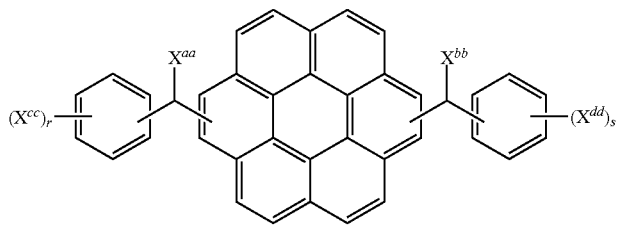

In Chemical Formulae 2-1 to 2-7, $X^{aa}$ to $X^{ff}$ may each independently be or include, e.g., a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

r, s and t may each independently be, e.g., an integer of 0 to 2, and $Q^4$ may be or may include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, in which $R^a$ may be hydrogen, a substituted or unsubstituted C1 to C10 alkyl group, a halogen atom, a halogen-containing group, or a combination thereof.

In an implementation, the polymer may have a weight average molecular weight of, e.g., about 1,000 to about 200,000. In an implementation, the monomer may have a molecular weight of, e.g., about 200 to about 5,000. Within the ranges, a carbon content and solubility in a solvent of the organic layer composition (e.g., a hardmask composition) may be optimized by selecting the amount of weight average molecular weight and/or molecular weight.

The solvent may include a suitable solvent having sufficient dissolubility or dispersion for the compound for an organic layer. In an implementation, the solvent may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer and the monomer may be included in the composition in an amount of about 0.1 to about 50 wt %, based on a total weight of the organic layer composition. When the polymer and the monomer are included in the range, a thickness, surface roughness, and planarization of the organic layer may be controlled.

The polymer and the monomer may be included in a weight ratio of about 9:1 to about 1:9, e.g., about 7:3 to about 3:7, about 6:4 to about 4:6, or about 5:5.

In an implementation organic layer composition may further include an additive, e.g., a surfactant, cross-linking agent, thermal acid generator, a plasticizer, or the like.

The surfactant may include, e.g., alkylbenzene sulfonate salt, alkyl pyridinium salt, polyethylene glycol, or a quaternary ammonium salt.

The cross-linking agent may be, e.g., a melamine-based, a substituted urea-based, or a polymer-based agent thereof. In an implementation, a cross-linking agent having at least two cross-linking forming substituent may be, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea, and the like.

In addition, the cross-linking agent may have high heat resistance. The cross-linking agent having high heat resistance may be a compound containing a cross-linking substituent having an aromatic ring (e.g., a benzene ring, a naphthalene ring) in its molecule.

The thermal acid generator may be, e.g., an acidic compound such as p-toluenesulfonic acid, trifluoromethanesulfonic acid, pyridinium-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, and the like.

The additive may be included in an amount of about 0.001 to about 40 parts by weight, based on 100 parts by weight of the organic layer composition. When the additive is included within the range, solubility may be improved without changing optical properties of the organic layer composition.

According to another embodiment, an organic layer manufactured using the organic layer composition is provided. The organic layer may be, e.g., formed by coating the organic layer composition on a substrate and heat-treating it for curing and may include, e.g., a hardmask layer, a planarization layer, a sacrificial layer, filler, and the like for an electronic device.

Hereafter, a method for forming patterns by using the organic layer composition is described.

A method of forming patterns according to one embodiment may include providing a material layer on a substrate, applying the organic layer composition, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer is a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. In an implementation, a thickness of the applied organic layer composition may be, e.g., about 50 Å to about 10,000 Å.

The heat-treating of the organic layer composition may be performed, e.g., at about 100 to about 500° C. for about 10 seconds to about 1 hour.

The silicon-containing thin layer may be formed of, e.g., SiCN, SiOC, SiON, SiOCN, SiC, SiN, and/or the like.

In an implementation, the method may further include forming a bottom antireflective coating (BARC) before forming the photoresist layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas and the etching gas may be, e.g., $CHF_3$, $CF_4$, $Cl_2$, $BCl_3$, and a mixed gas thereof.

The etched material layer may be formed in a plurality of patterns, and the plurality of patterns may include a metal pattern, a semiconductor pattern, an insulation pattern, or the like, e.g., diverse patterns of a semiconductor integrated circuit device.

Hereinafter, the present disclosure is illustrated in more detail with reference to examples. However, these examples are exemplary, and the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Polymerization Examples

Polymerization Example 1

11.7 g (0.1 mol) of 1H-indole, 18 g (0.1 mol) of 9-fluorenone, 9.5 g (0.05 mol) of p-toluene sulfonic acid hydrate, and 91 g of 1,4-dioxane were put in a flask and then agitated at 100° C. When a specimen taken from the obtained polymerization reactant every hour had a weight average molecular weight ranging from 2,000 to 3,000, the reaction was completed. When the reaction was complete, 100 g of hexane was added thereto, 1,4-dioxane was extracted, methanol was added thereto, a precipitate produced therein was filtered, and a monomer remaining there was removed by using methanol, obtaining a polymer including a repeating unit represented by Chemical Formula 1aa (weight average molecular weight (Mw)=2,500).

[Chemical Formula 1aa]

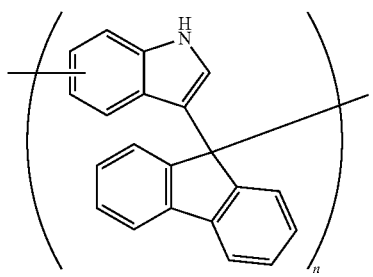

Polymerization Example 2

A polymer including a repeating unit represented by Chemical Formula 1bb (a weight average molecular weight (Mw)=2,300) was obtained according to the same method as Synthesis Example 1 except for using 19.3 g (0.1 mol) of 2-phenyl-1H-indole, 18 g (0.1 mol) of 9-fluorenone, 9.5 g (0.05 mol) of p-toluene sulfonic acid hydrate, and 91 g of 1,4-dioxane.

[Chemical Formula 1bb]

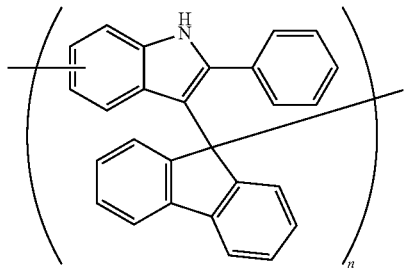

Polymerization Example 3

Synthesis of Chemical Formula S1

1 g (3.2 mmol) of 4,4'-dibromo biphenyl was dissolved in 20 mL of tetrahydrofuran, and 3 mL of 2.5 M (n-BuLi 2.5 M in hexane) n-BuLi was slowly added thereto in a dropwise fashion at −78° C. After 30 minutes, 1.2 g (6.4 mmol) of 9-fluorenone dissolved in THF was slowly added thereto in a dropwise fashion, and the mixture was agitated at ambient temperature for 15 hours. Then, a reaction solution obtained therefrom was neutralized to pH=7 by using 1 N hydrochloric acid and then, extracted with EtOAc, and a solvent was removed therefrom. Subsequently, a product therefrom was separated through column chromatography, obtaining the following compound S1.

S1

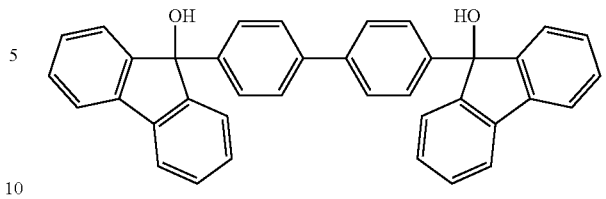

Subsequently, a polymer including a repeating unit represented by Chemical Formula 1cc (a weight average molecular weight (Mw)=2,900) was obtained according to the same method as Synthesis Example 1 except for using 5.9 g (50 mmol) of 1H-indole, 25.7 g (50 mmol) of compound S1, 4.7 g (25 mmol) of p-toluene sulfonic acid hydrate, and 85 g of 1,4-dioxane.

[Chemical Formula 1cc]

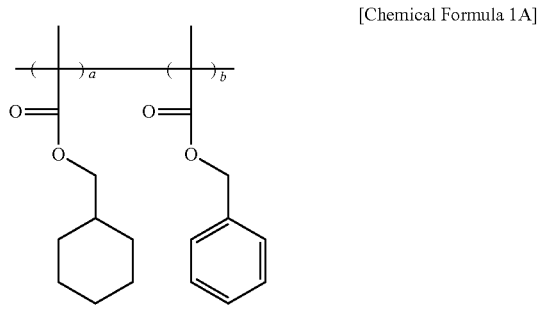 [SMILES: CC(C)(C(=O)OCc1ccccc1)C(C)(C)C(=O)OCC1CCCCC1]

Comparative Polymerization Example 1

10 g (0.057 mol) of benzomethacrylate and 10.6 g (0.057 mol) of cyclohexylmethyl methacrylate were mixed in 41 g of methylethylketone under a nitrogen atmosphere in a flask. Then, 2.6 g of dimethyl-2,2'-azobis(2-methylpropionate) as a polymerization initiator was added to the mixture at 80° C. for 4 hours with a syringe, and the mixture was additionally agitated for 2 hours. When the polymerization was complete, the obtained polymer was slowly precipitated in an excess of a hexane solvent. Accordingly, a precipitate produced therein was filtered and then, dissolved in an appropriate amount of a mixed solvent of hexane/isopropanol, and the solution was agitated. Subsequently, the obtained precipitate was dried in a 50° C. vacuum oven for about 24 hours, obtaining a polymer including repeating units represented by Chemical Formula 1A.

The obtained polymer had a weight average molecular weight (Mw) of 6,200 and polydispersity (Mw/Mn) of 1.45.

[Chemical Formula 1A]

In Chemical Formula 1A, a:b=1:1.

Comparative Polymerization Example 2

50.0 g (0.143 mol) of 9,9'-bis(4-hydroxyphenyl)fluorene, 23.7 g (0.143 mol) of 1,4-bis(methoxymethyl)benzene and 50 g of propylene glycol monomethylether acetate were put in a flask to prepare a solution. Next, 1.10 g (7.13 mmol) of diethyl sulfate was added to the solution, and the mixture was agitated at 100° C. for 24 hours. When the polymerization was complete, the resultant was precipitated in methanol, and a monomer and a low molecular weight product were removed, obtaining a polymer including a repeating unit represented by Chemical Formula 1B. A weight average molecular weight of the polymer was 33,500.

[Chemical Formula 1B]

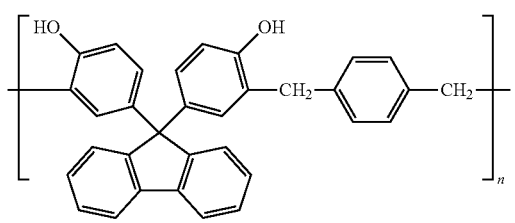

Synthesis Example

Synthesis Example 1

First Step: Friedel-Craft Acylation Reaction 15.85 g (0.05 mol) of benzopyrene, 23.13 g (0.105 mol) of methoxy naphthoyl chloride, and 214 g of dichloroethane were put in a flask. Then, 14.68.7 g (0.11 mol) of aluminum chloride was slowly added to the solution, and the mixture was agitated at ambient temperature for 1 hour. When the reaction was complete, methanol was added thereto, and a precipitate produced therein was filtered and dried.

Second Step: Demethylation Reaction

The compound obtained in the first step, 36.21 g (0.18 mol) of 1-dodecanethiol, 12.55 g (0.22 mol) of potassium hydroxide, and 315 g of N,N-dimethyl formamide were put in a flask and then, agitated at 120° C. for 8 hours. Subsequently, the mixture was cooled down, neutralized to pH 7 with 5% hydrogen chloride solution, extracted with ethyl acetate, and then dried.

Third Step: Reduction Reaction

The compound obtained in the second step was dissolved in 100 mL of tetrahydrofuran in a flask, and 22.98 g (0.60 mol) of lithium aluminum hydride was little by little added thereto for a reaction. When the reaction was complete, a monomer represented by Chemical Formula 2aa was obtained by removing a by-product from the reaction with a mixture of water/methanol.

[Chemical Formula 2aa]

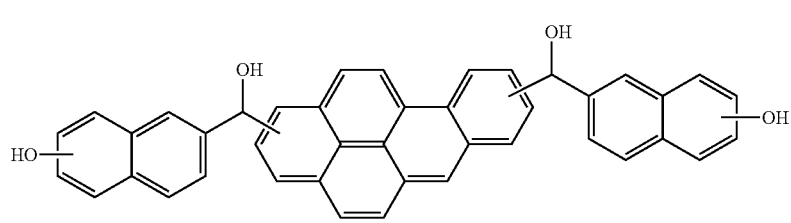

Synthesis Example 2

First Step: Friedel-Craft Acylation Reaction 20.6 g (0.101 mol) of terephthaloyl chloride, 47.0 g (0.203 mol) of methoxypyrene, and 221 g of 1,2-dichloroethane were put in a flask. Then, 27 g (0.203 mol) of aluminum chloride was slowly added to the solution, and the mixture was agitated at 60° C. for 8 hours. When the reaction was complete, a precipitate formed by adding methanol thereto was filtered and dried.

Second Step: Demethylation Reaction 53.5 g (0.090 mol) of the compound obtained in the first step, 91.1 g (0.450 mol) of 1-dodecanethiol, 30.3 g (0.540 mol) of potassium hydroxide and 262 g of N, N-dimethylformamide were put in a flask and agitated at 120° C. for 8 hours. The reaction mixture was cooled down and neutralized to about pH 6-7 with a 5% hydrochloric acid solution, and a precipitate formed therein was filtered and dried.

Third Step: Reduction Reaction 24.0 g (0.042 mol) of the compound obtained in the second step and 160 g of tetrahydrofuran were put in a flask. Then, 16.0 g (0.424 mol) of a sodium borohydride aqueous solution was slowly added thereto, and the mixture was agitated at ambient temperature for 24 hours. When the reaction was complete, the resultant was neutralized to about pH 7 with a 5% hydrochloric acid solution, extracted with ethyl acetate, and dried, obtaining a monomer represented by Chemical Formula 2bb.

[Chemical Formula 2bb]

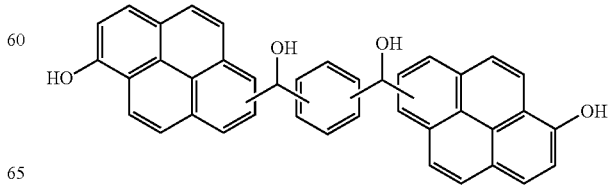

Synthesis Example 3

First Step: Friedel-Craft Acylation Reaction 28.0 g (0.1345 mol) of 1.4-cyclohexanedicarbonyldichloride, 62.4 g (0.269 mol) of methoxypyrene and 496 g of 1,2-dichloroethane were put in a flask. Then, 17.9 g (0.1345 mol) of aluminum chloride was slowly added to the solution, and the mixture was agitated at ambient temperature for 12 hours. When the reaction was complete, a precipitate formed by adding methanol thereto was filtered and dried.

Second Step: Demethylation Reaction 6.00 g (0.01001 mol) of the compound, 10.13 g (0.05005 mol) of 1-dodecanethiol, 3.37 g (0.06006 mol) of potassium hydroxide and 30.3 g of N,N-dimethylformamide were put in a flask and then, agitated at 120° C. for 8 hours. The reaction mixture was cooled down and neutralized to about pH 6-7 with a 5% hydrochloric acid solution, and a precipitate formed therein was filtered and dried.

Third Step: Reduction Reaction 4.00 g (0.00699 mol) of the compound obtained in the second step and 28.5 g of tetrahydrofuran were put in a flask. Then, 5.29 g (0.1398 mol) of a sodium borohydride aqueous solution was slowly added to the solution, and the mixture was agitated at ambient temperature for 24 hours. When the reaction was complete, the resultant was neutralized to about pH 7 with a 5% hydrochloric acid solution, extracted with ethyl acetate, and dried, obtaining a monomer represented by Chemical Formula 2cc.

[Chemical Fomrula 2cc]

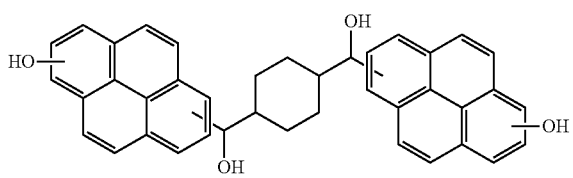

Synthesis Example 4

27.6 g (0.1 mol) of benzoperylene and 61 g (0.32 mol) of naphthoyl chloride along with 500 g of a mixed solution of chloroform/dichloromethane were put in a flask. Subsequently, the mixture was agitated with a stirring bar, and 85.7 g (0.35 mol) of trichloroaluminum was little by little added thereto for a reaction. When the reaction was complete, water was used to remove trichloroaluminum, a reactant obtained as powder therefrom was dissolved in tetrahydrofuran, and 18.98 g (0.5 mol) of lithium aluminum hydride was added thereto for a reaction. When the reaction was complete, a monomer represented by Chemical Formula 2dd was obtained by removing a by-product from the reaction with a mixture of water/methanol.

[Chemical Formula 2dd]

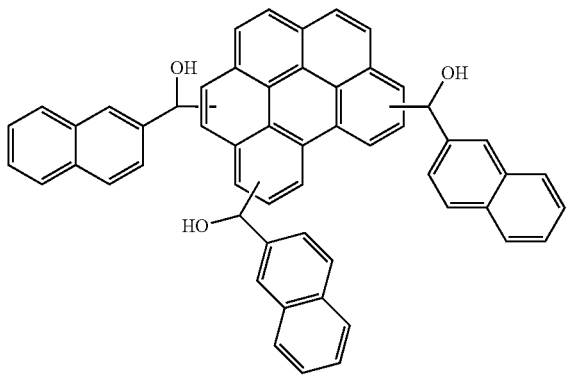

Synthesis Example 5

21.8 g (0.105 mol) of phenanthro[4,5-bcd]thiophene) and 48.5 g (0.22 mol) of methoxy naphthoyl chloride along with 500 g of a mixed solution of chloroform/dichloromethane were put in a flask. Subsequently, the mixture was agitated with a stirring bar, and 61.2 g (0.35 mol) of aluminum chloride was little by little added thereto for a reaction. When the reaction was complete, water was used to remove a byproduct from the reaction and non-reacted aluminum chloride, and a reactant obtained as powder was heated and refluxed along with 40 ml of formamide and 5 ml of 85% formic acid at 190° C. for 3 hours. The reactant was cooled down to a temperature of less than or equal to 100° C. and added to 250 ml of water at ambient temperature, and a precipitate produced therein was filtered and washed with a mixture of water/methanol to remove a by-product from the reaction, obtaining a monomer represented by Chemical Formula 2ee.

[Chemical Formula 2ee]

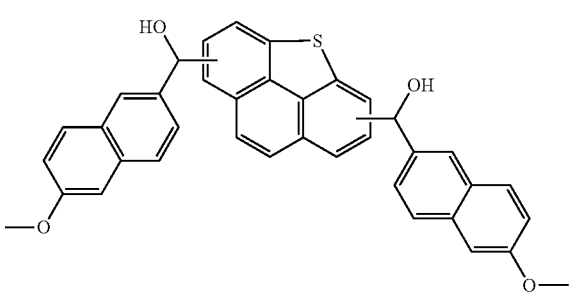

Synthesis Example 6

40.5 g (200 mmol) of pyrene, 15.7 g (200 mmol) of acetyl chloride and 405 g of 1,2-dichloroethane were put in a flask. Then, 26.7 g (200 mmol) of aluminum chloride was slowly added to the solution, and the mixture was agitated at ambient temperature for 24 hours. When the reaction was complete, the resultant was cooled down to ambient temperature and neutralized by adding a KOH aqueous solution thereto. Subsequently, an organic layer was separated and dried.

24.3 g (100 mmol) of the compound obtained by the above process, 29.8 g (400 mmol) of sodium hypochlorite, 23.7 g (300 mmol) of pyridine and 243.3 g of 1,2-dichloroethane were put in a flask and agitated at 80° C. for 24 hours. The reaction mixture was cooled down and neutralized to about pH 6-7 with a 5% hydrochloric acid solution, and then, an organic layer was separated and dried.

24.6 g (100 mmol) of the compound obtained by the above process, 15.23 g (120 mmol) of oxalyl chloride, 0.08 g (1 mmol) of DMF, and 246 g of 1,2-dichloroethane were put in a flask and then, agitated at 60° C. for 12 hours. When the reaction was complete, the resultant was cooled down to ambient temperature and neutralized by adding a KOH aqueous solution thereto, and an organic layer was separated therefrom and dried.

30 g (100 mmol) of the compound obtained from the above process, 23.2 g (100 mmol) of methoxy pyrene, and 202 g of 1,2-dichloroethane were put in a flask. Then, 13.4 g (100 mmol) of aluminum chloride was slowly added to this solution, and this mixture was agitated at ambient temperature for 12 hours. When the reaction was complete, the resultant was cooled down to ambient temperature and neutralized by adding a KOH aqueous solution thereto. Subsequently, an organic layer was separated therefrom and dried.

36.8 g (80 mmol) of the compound obtained from the above process, 11.2 g (80 mmol) of benzoyl chloride, and 186.3 g of 1,2-dichloroethane were put in a flask. Then, 10.7 g (80 mmol) of aluminum chloride was slowly added to the solution, and the mixture was agitated at ambient temperature for 12 hours. When the reaction was complete, the resultant was neutralized by adding a KOH aqueous solution thereto. Subsequently, an organic layer was separated therefrom and dried.

33.8 g (60 mmol) of the compound obtained from the above process and 152.5 g of tetrahydrofuran were put in a flask. Then, 8.94 g (120 mmol) of a sodium borohydride aqueous solution was slowly added to the solution, and the mixture was agitated at ambient temperature for 24 hours. When the reaction was complete, the resultant was neutralized to about pH 7 with a 5% hydrochloric acid solution, extracted with ethyl acetate, and dried, obtaining a monomer represented by Chemical Formula 2ff.

[Chemical Formula 2ff]

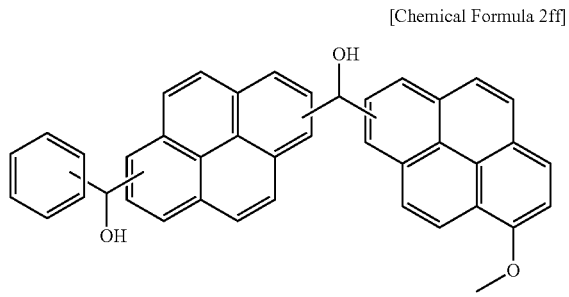

Synthesis Example 7

First Step: Friedel-Craft Acylation Reaction 50.0 g (0.166 mol) of coronene, 46.8 g (0.333 mol) of benzoylchloride, and 330 g of 1,2-dichloroethane were put in a flask, preparing a solution. Subsequently, 44.4 g (0.333 mol) of aluminum chloride was slowly added to the solution at ambient temperature, and the mixture was heated up to 60° C. and agitated for 8 hours. When the reaction was complete, a precipitate formed by adding methanol to the solution was filtered and dried.

Second Step: Reduction Reaction 25.0 g (0.0492 mol) of the coupling compound and 174 g of tetrahydrofuran were put in a flask. Subsequently, 18.6 g (0.492 mol) of sodium borohydride aqueous solution was slowly added to the solution, and the mixture was agitated at ambient temperature for 24 hours. When the reaction was complete, the resultant was neutralized to about pH 7 with a 5% hydrogen chloride solution, extracted with ethyl acetate, and dried, obtaining a compound represented by Chemical Formula 2gg.

[Chemical Formula 2gg]

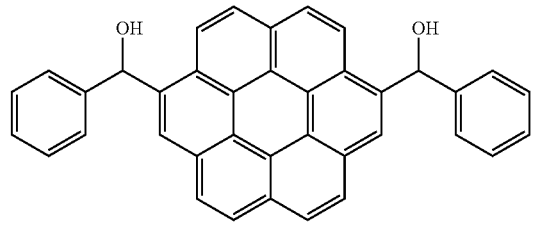

Preparation of Hardmask Composition

Example 1

The polymer of Polymerization Example 1 and the monomer of Synthesis Example 1 were dissolved in a mixed solvent of propylene glycol monomethylether acetate (PGMEA) and cyclohexanone (7:3 (v/v)), and the solution was filtered, preparing a hardmask composition. The weight sum of the polymer and the monomer (a weight ratio=7:3) was adjusted in a range of 3.0 wt % to 15.0 wt % based on the entire weight of the hardmask composition (depending on a desired thickness).

Example 2

A hardmask composition was prepared according to the same method as Example 1 except for using the polymer of Polymerization Example 2 instead of the polymer of Polymerization Example 1.

Example 3

A hardmask composition was prepared according to the same method as Example 1 except for using the monomer of Synthesis Example 2 instead of the monomer of Synthesis Example 1 and using the polymer and the monomer in a weight ratio of 5:5.

Example 4

A hardmask composition was prepared according to the same method as Example 1 except for using the polymer of Polymerization Example 2 and the monomer of Synthesis Example 2 and using the polymer and the monomer in a weight ratio of 5:5.

Example 5

A hardmask composition was prepared according to the same method as Example 1 except for using the polymer of Polymerization Example 3 and the monomer of Synthesis Example 2 and using the polymer and the monomer in a weight ratio of 5:5.

Example 6

A hardmask composition was prepared according to the same method as Example 1 except for using the polymer of Polymerization Example 3 and the monomer of Synthesis Example 2.

Example 7

A hardmask composition was prepared according to the same method as Example 1 except for using the monomer of Synthesis Example 4 instead of the monomer of Synthesis Example 1.

Example 8

A hardmask composition was prepared according to the same method as Example 1 except for using the monomer of Synthesis Example 5 instead of the monomer of Synthesis Example 1 and using the polymer and the monomer in a weight ratio of 5:5.

Example 9

A hardmask composition was prepared according to the same method as Example 1 except for using the polymer of Polymerization Example 2 and the monomer of Synthesis Example 5 and using the polymer and the monomer in a weight ratio of 5:5.

Example 10

A hardmask composition was prepared according to the same method as Example 1 except for using the monomer of Synthesis Example 6 instead of the monomer of Synthesis Example 1.

Example 11

A hardmask composition was prepared according to the same method as Example 1 except for using the polymer of Polymerization Example 2 and the monomer of Synthesis Example 6 instead of the monomer of Synthesis Example 1.

Comparative Example 1

A hardmask composition was prepared according to the same method as Example 1 except for using the polymer of Comparative Polymerization Example 1 alone.

Comparative Example 2

A hardmask composition was prepared according to the same method as Example 1 except for using the polymer of Comparative Polymerization Example 2 alone.

Comparative Example 3

A hardmask composition was prepared according to the same method as Example 1 except for using the polymer of Comparative Polymerization Example 1 and the monomer of Synthesis Example 7.

The compositions of the hardmask compositions according to Examples 1 to 11 and Comparative Examples 1 to 3 are provided in Table 1.

TABLE 1

| | Polymer | Monomer | Composition (weight ratio = polymer:monomer) |
|---|---|---|---|
| Example 1 | Chemical Formula 1aa | Chemical Formula 2aa | 7:3 |
| Example 2 | Chemical Formula 1bb | | 7:3 |
| Example 3 | Chemical Formula 1aa | Chemical Formula 2bb | 5:5 |
| Example 4 | Chemical Formula 1bb | | 5:5 |
| Example 5 | Chemical Formula 1cc | | 5:5 |
| Example 6 | Chemical Formula 1cc | Chemical Formula 2cc | 7:3 |
| Example 7 | Chemical Formula 1aa | Chemical Formula 2dd | 7:3 |
| Example 8 | Chemical Formula 1aa | Chemical Formula 2ee | 5:5 |
| Example 9 | Chemical Formula 1bb | | 5:5 |
| Example 10 | Chemical Formula 1aa | Chemical Formula 2ff | 7:3 |
| Example 11 | Chemical Formula 1bb | | 7:3 |
| Comparative Example 1 | Chemical Formula 1A | — | — |
| Comparative Example 2 | Chemical Formula 1B | — | — |
| Comparative Example 3 | Chemical Formula 1A | Chemical Formula 2gg | 7:3 |

Evaluation

Evaluation 1: Planarization Characteristics

Each hardmask composition (4 wt %) according to Examples 1 to 11 and Comparative Examples 1 and 2 was spin-on coated on a silicon wafer having a pattern and heat-treated at 400° C. for 120 seconds, respectively forming a thin film.

Herein, gap-fill characteristics of the thin film were evaluated by examining whether the cross-section of the pattern had a void or not with a FE-SEM, and planarization characteristics of the film was evaluated by measuring the thickness of the thin film from the image of the cross-section of the pattern obtained from the FE-SEM and calculated according to Calculation Equation 1 in FIG. 1. Herein, the smaller difference h1 and h2 had, the better the planarization characteristics were.

The results are provided in Table 2.

TABLE 2

| | Planarization characteristics | Gap-fill characteristics |
|---|---|---|
| Example1 | 9.9 | No void |
| Example2 | 11.8 | No void |
| Example3 | 10.8 | No void |
| Example4 | 11.6 | No void |
| Example5 | 11.9 | No void |
| Example6 | 11.1 | No void |
| Example7 | 12.2 | No void |
| Example8 | 11.4 | No void |
| Example9 | 11.7 | No void |
| Example10 | 10.8 | No void |
| Example11 | 11.3 | No void |
| Comparative Example 1 | 15.8 | No void |
| Comparative Example 2 | 18.2 | No void |

Referring to Table 2, each thin film respectively formed of the hardmask compositions according to Examples 1 to 11 had no void (unlike the thin films respectively formed of the hardmask compositions according to Comparative Examples 1 and 2) and showed satisfactory gap-fill characteristics.

In addition, each thin film respectively formed of the hardmask compositions according to Examples 1 to 11 exhibited excellent planarization characteristics, compared with the thin films respectively formed of the hardmask compositions according to Comparative Examples 1 and 2.

Evaluation 2: Etch Resistance

The hardmask compositions (4 wt %) according to Examples 1 to 11 and Comparative Examples 1 and 3 were respectively heat-treated on a silicon wafer at 400° C. for 120 seconds, forming each thin film, and the thickness of the thin film was measured. Subsequently, the thin film was dry-etched by using $N_2/O_2$ mixed gas (50 mT/300 W/10$O_2$/50$N_2$) and $CF_x$ gas (100 mT/600 W/42$CF_4$/600Ar/15$O_2$) for 60 seconds and 120 seconds respectively, and the thickness of the thin film was measured again. The thicknesses of the thin film before and after the dry etching and etching time were used to calculate a bulk etch rate (BER) according to Calculation Equation 2.

(Thickness of initial thin film−Thickness of thin film after etching)/Etching time (Å/s) [Calculation Equation 2]

The results are provided in Table 3.

TABLE 3

|  | Bulk etch rate (Å/s) | |
| --- | --- | --- |
|  | $N_2/O_2$ etch | CFx etch |
| Example 1 | 23.3 | 24.1 |
| Example 2 | 23.2 | 24.0 |
| Example 3 | 23.5 | 23.3 |
| Example 4 | 23.0 | 23.3 |
| Example 5 | 23.0 | 23.3 |
| Example 6 | 24.2 | 25.8 |
| Example 7 | 24.4 | 24.6 |
| Example 8 | 24.5 | — |
| Example 9 | 24.5 | — |
| Example 10 | 23.9 | — |
| Example 11 | 23.8 | — |
| Comparative Example 1 | 29.7 | 32.4 |
| Comparative Example 3 | 25.3 | 26.1 |

Referring to Table 3, each thin film respectively formed of the hardmask compositions according to Examples 1 to 11 exhibited sufficient etch resistance against etching gas and thus, exhibited improved bulk etch characteristics, compared with the thin films respectively formed of the hardmask compositions according to Comparative Examples 1 and 3.

Evaluation 3: Heat Resistance

The hardmask composition (10 wt %) according to Examples 1 to 11 and Comparative Examples 1 and 3 were respectively spin-on coated on a silicon wafer and then, heat-treated on a hot plate at 240° C. for 1 minute, forming each thin film. The thickness of the thin film was measured by using a thickness-meter made by K-MAC. Subsequently, the thin film was heat-treated at 400° C. for 2 minutes, the thickness of the thin film was measured, and then, the thickness decrease ratio of the thin film was calculated according to Calculation Equation 3.

(Thickness of thin film after baking at 240° C.−Thickness of thin film after baking at 400° C.)/(Thickness of thin film after baking at 240° C.)×100(%) [Calculation Equation 3]

The results are provided in Table 4.

TABLE 4

|  | Thickness decrease ratio of thin film (%) |
| --- | --- |
| Example 1 | 9.3 |
| Example 2 | 10.3 |
| Example 3 | 11.1 |
| Example 4 | 12.7 |
| Example 5 | 10.7 |
| Example 6 | 8.8 |
| Example 7 | 9.2 |
| Example 10 | 10.2 |
| Example 11 | 11.1 |
| Comparative Example 1 | 15.7 |
| Comparative Example 3 | 13.2 |

Referring to Table 4, each thin film formed of the hardmask compositions according to Examples 1 to 11 exhibited a small thickness decrease ratio during the heat treatment at 400° C. and thus, exhibited excellent heat resistance at a high temperature, compared with the thin films formed of the hardmask compositions according to Comparative Examples 1 and 3.

By way of summation and review, some lithographic techniques include providing a material layer on a semiconductor substrate; coating a photoresist layer thereon; exposing and developing the same to provide a photoresist pattern; and etching the material layer using the photoresist pattern as a mask.

Due to the small-sizing of a pattern to be formed, it may be difficult to provide a fine pattern having an excellent profile by some typical lithographic techniques. Accordingly, a layer, called a hardmask layer, may be formed between the material layer and the photoresist layer to provide a fine pattern.

The hardmask layer may play a role of an intermediate layer for transferring the fine pattern of photoresist to the material layer through the selective etching process. Accordingly, the hardmask layer may have characteristics such as heat resistance, etch resistance, and the like to be tolerated during the multiple etching processes.

Forming a hardmask layer by a spin-on coating method instead of the chemical vapor deposition has been considered. The spin-on coating method may be easy to perform and may also help improve gap-fill characteristics and planarization characteristics. The gap-fill characteristics of filling a pattern with the layer without a space may be desirable when multiple patterns are used to realize a fine pattern. In addition, the planarization characteristics of planarizing the surface of the layer with a lower layer may be used when a substrate has a bump, or a wafer as the substrate has both a pattern-dense region and no pattern region.

The embodiments may provide an organic layer material satisfying the characteristics for a hardmask layer.

The embodiments may provide an organic layer composition capable of improving film density and etch resistance and ensuring excellent solubility.

The embodiments may provide an organic layer having improved mechanical characteristics and planarization characteristics.

The embodiments may provide an organic layer simultaneously providing etch resistance, heat resistance, and planarization characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic layer composition, comprising:
a polymer that includes a moiety represented by Chemical Formula 1,
a monomer represented by Chemical Formula 2, and
a solvent,

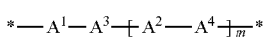

[Chemical Formula 1]

wherein, in Chemical Formula 1,
$A^1$ and $A^2$ are each independently a divalent group of a compound listed in Group 1,
$A^3$ and $A^4$ are each independently a cyclic group including at least one substituted or unsubstituted benzene ring,
m is 0 or 1, and
"*" is a linking point,

[Group 1]

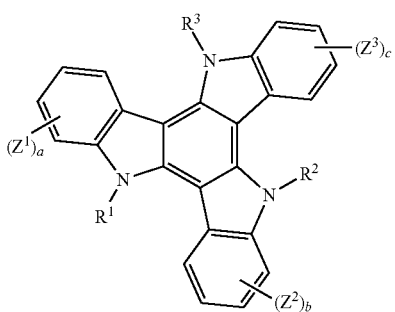

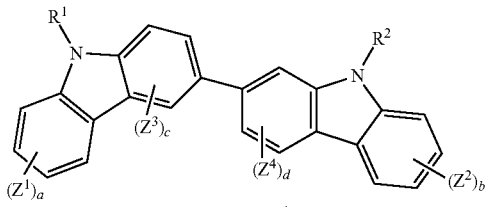

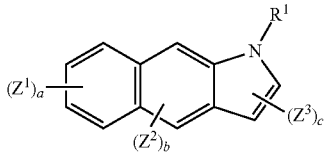

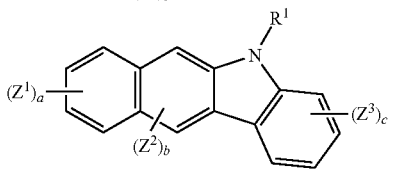

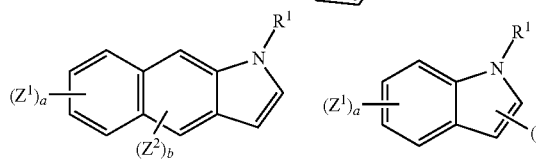

-continued

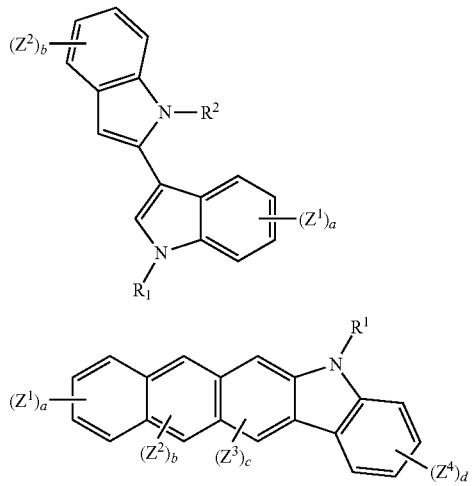

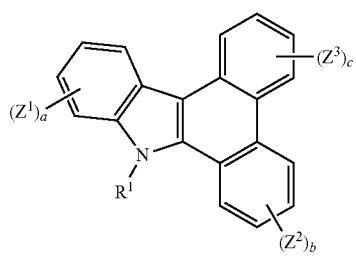

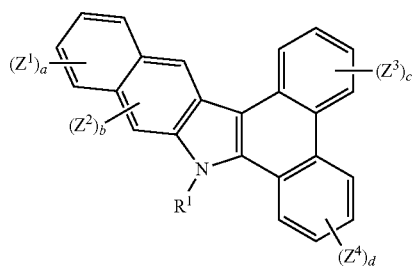

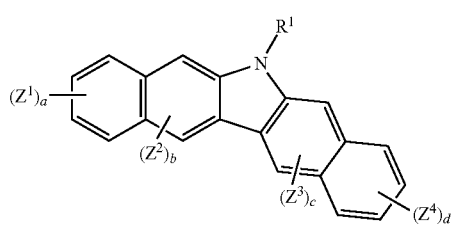

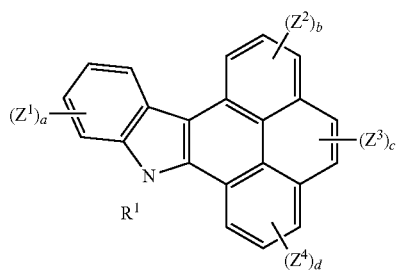

-continued

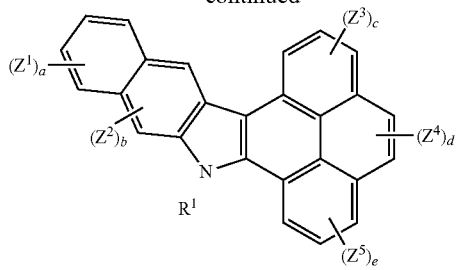

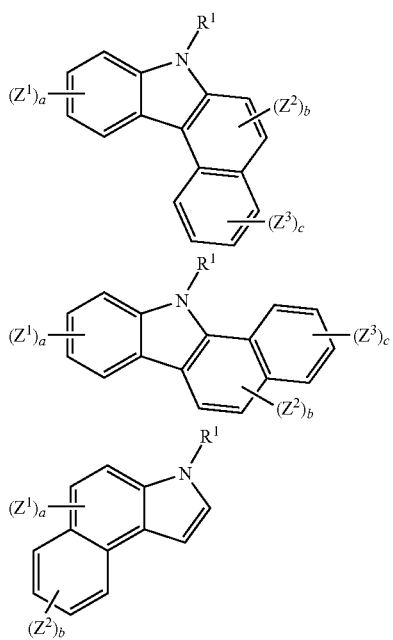

-continued

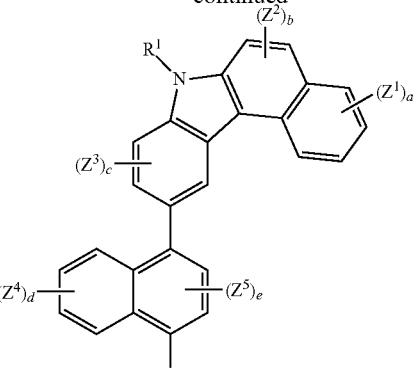

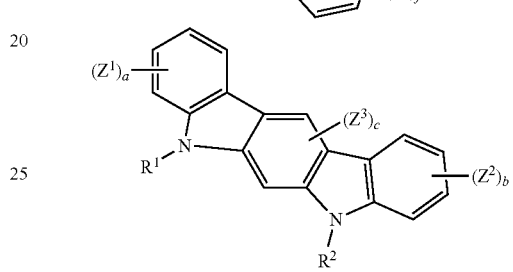

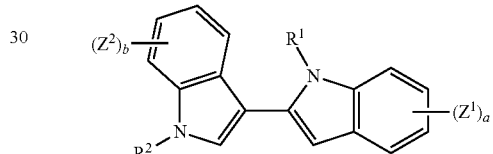

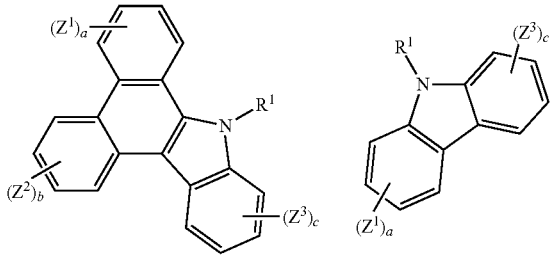

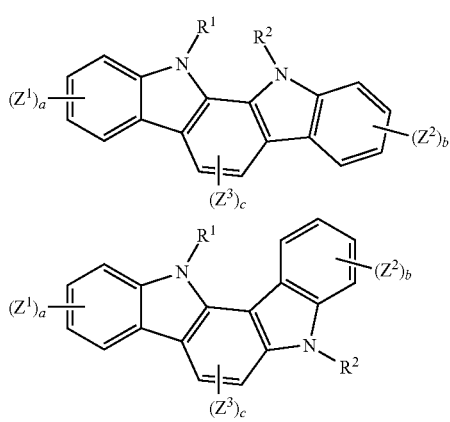

wherein, in Group 1,

R¹, R², and R³ are each independently hydrogen, a hydroxy group, a methoxy group, an ethoxy group, a halogen, a substituted or unsubstituted C6 to C30 aryl group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2,

[Chemical Formula 2]

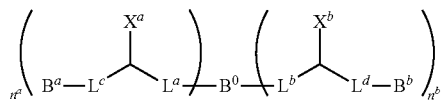

wherein, in Chemical Formula 2, $B^0$ is a substituted or unsubstituted C3 to C60 cyclic group, a substituted or unsubstituted C1 to C20 alkylene group, a substituted or unsubstituted C2 to C20 alkenylene group, a substituted or unsubstituted C2 to C20 alkynylene group, or a combination thereof, $B^a$ and $B^b$ are each independently substituted or unsubstituted C3 to C60 cyclic group, $X^a$ and $X^b$ are each independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, $L^a$, $L^b$, $L^c$, and $L^d$ are each independently a single bond, a substituted or unsubstituted C1 to C6 alkylene group, a substituted or unsubstituted C6 to C30 arylene group, or a combination thereof, and $n^a$ and $n^b$ are each independently an integer of 1 to 6, provided that $n^a+n^b \leq$ a maximum number of substituents of $B^0$.

2. The organic layer composition as claimed in claim 1, wherein, in Chemical Formula 1, $A^3$ and $A^4$ are each independently one of the following groups:

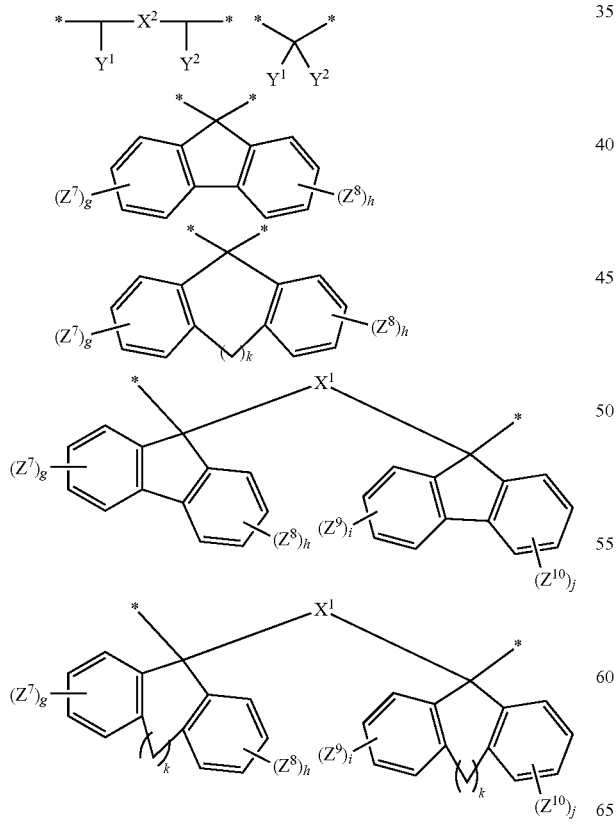

wherein, in the above groups, $X^1$ and $X^2$ are each independently a substituted or unsubstituted C6 to C50 arylene group, a substituted or unsubstituted C1 to C10 alkyleneoxide-containing group, or a combination thereof, $Y^1$ and $Y^2$ are each independently substituted or unsubstituted C6 to C30 aryl group, $Z^7$ to $Z^{10}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, g, h, i, and j are each independently an integer of 0 to 2, k is an integer of 1 to 3, and "*" is a linking point.

3. The organic layer composition as claimed in claim 2, wherein $X^1$ and $X^2$ are each independently a substituted or unsubstituted C6 to C50 arylene group, the C6 to C50 arylene group being a divalent group of one of the following compounds:

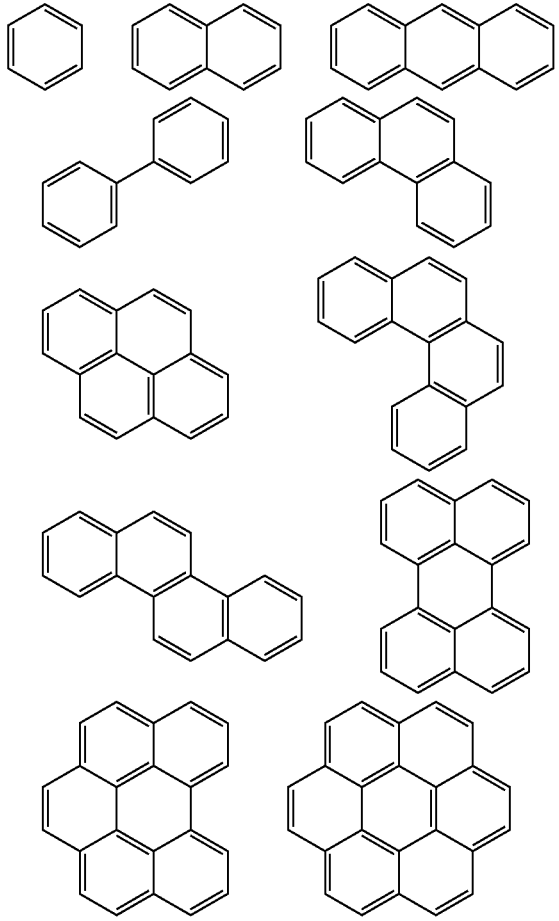

4. The organic layer composition as claimed in claim 2, wherein $Y^1$ and $Y^2$ are each independently a substituted or unsubstituted C6 to C30 aryl group, the C6 to C30 aryl group being a monovalent group of one of the following compounds:

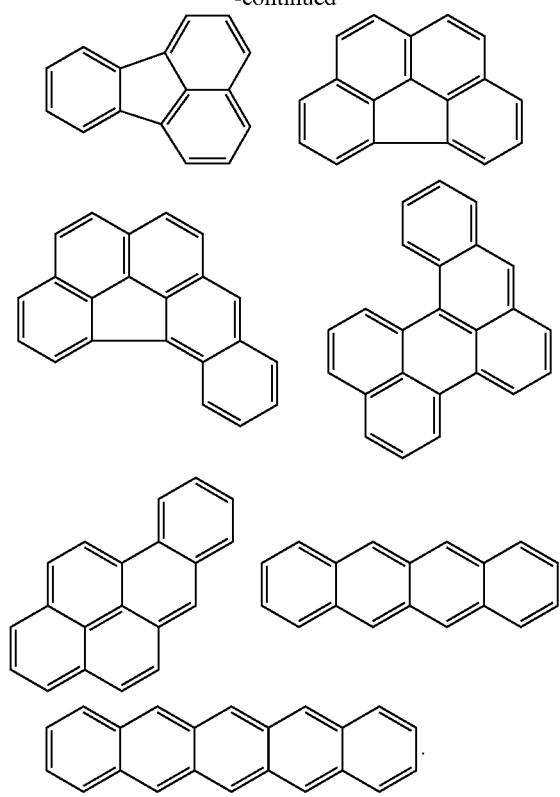
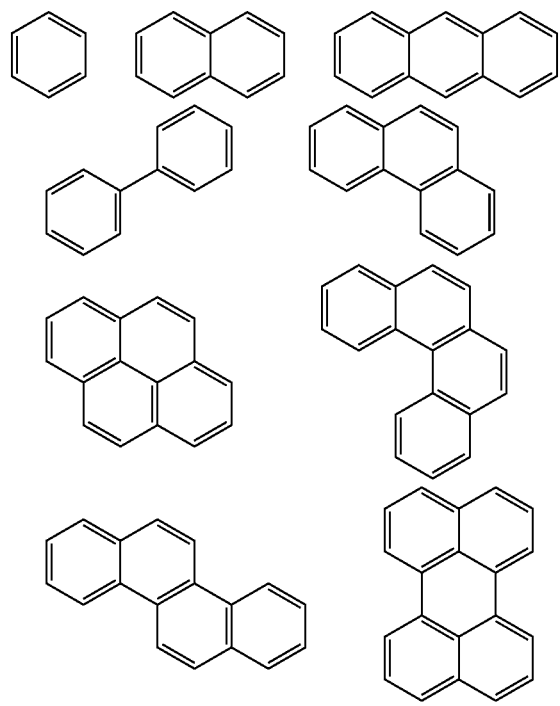

5. The organic layer composition as claimed in claim 1, wherein, in Group 1, $R^1$, $R^2$, and $R^3$ are each independently hydrogen or a substituted or unsubstituted phenyl group.

6. The organic layer composition as claimed in claim 1, wherein, in Chemical Formula 2, the cyclic group of $B^0$, $B^a$, or $B^b$ is a group including one of the following moieties:

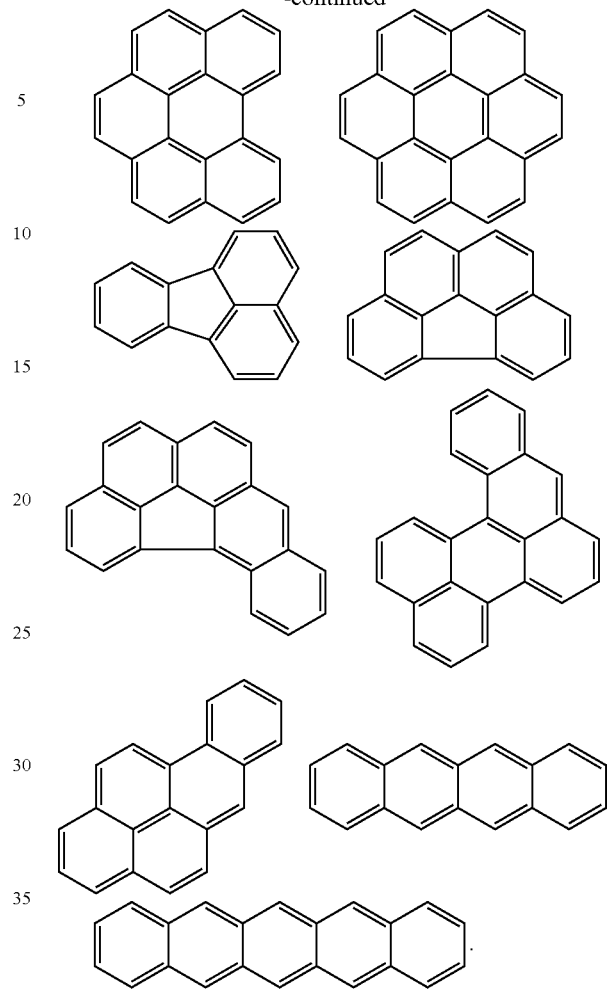
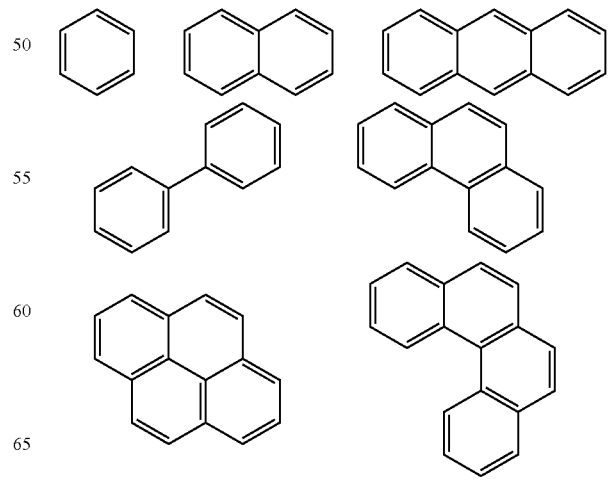

-continued

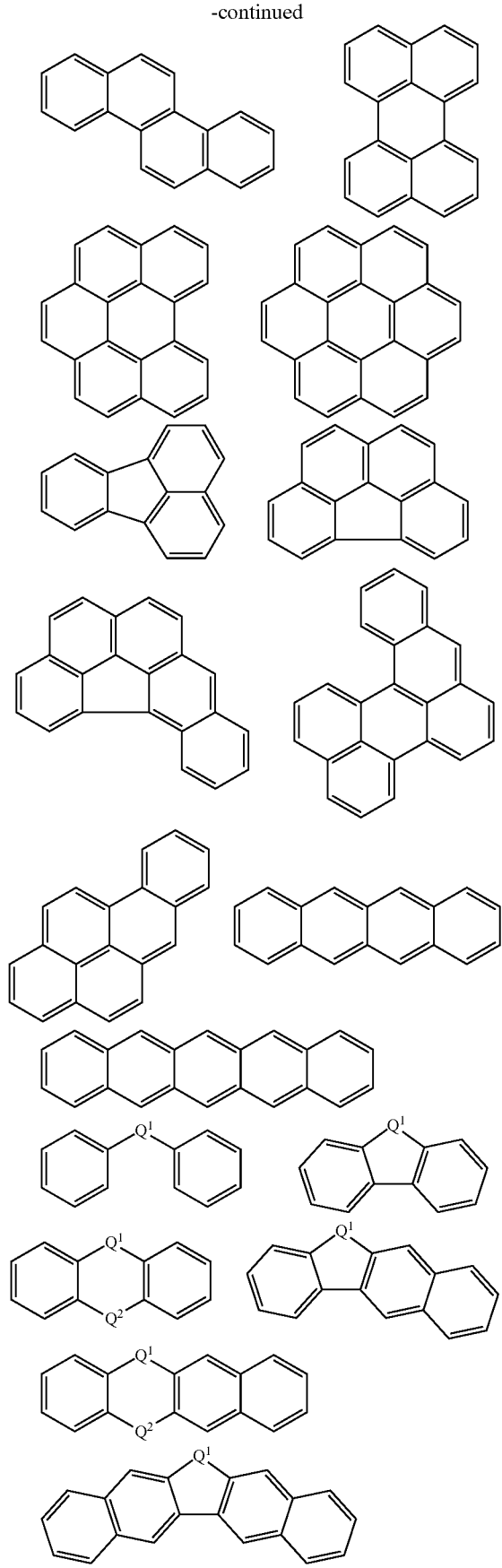

-continued

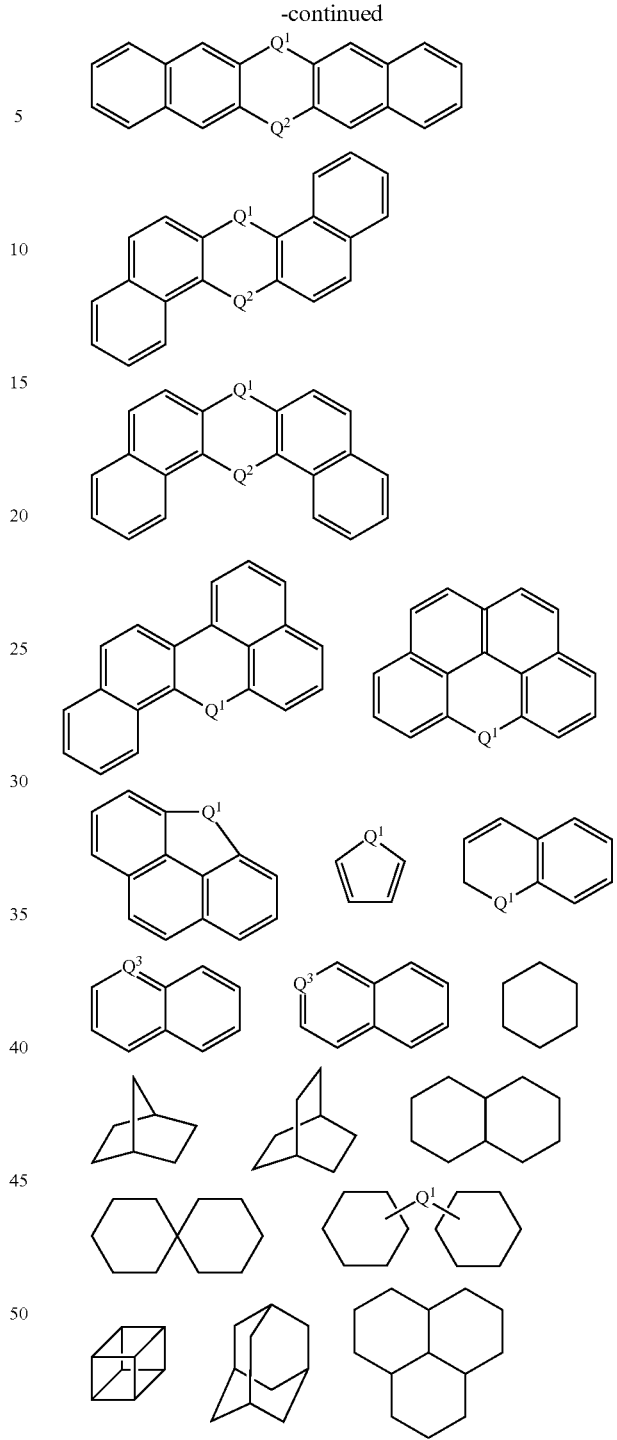

wherein, in the above compounds,

Q¹ and Q² are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, and $Q^3$ is nitrogen (N), $CR^b$, or a combination thereof, wherein $R^a$ and $R^b$ are each independently hydrogen, a substituted or unsubstituted C1 to C10 alkyl group, a halogen atom, a halogen-containing group, or a combination thereof.

7. The organic layer composition as claimed in claim 1, wherein, in Chemical Formula 2, at least one of $B^0$, $B^a$, and $B^b$ is a substituted or unsubstituted polycyclic group.

8. The organic layer composition as claimed in claim 7, wherein, in Chemical Formula 2, at least one of $B^0$, $B^a$, and $B^b$ is a substituted or unsubstituted polycyclic aromatic group.

9. The organic layer composition as claimed in claim 1, wherein, in Chemical Formula 2, $n^a+n^b$ is 2 or 3.

10. The organic layer composition as claimed in claim 1, wherein the polymer that includes a moiety represented by Chemical Formula 1 includes a moiety represented by one of the following Chemical Formulae 1-1 to 1-3:

[Chemical Formula 1-1]

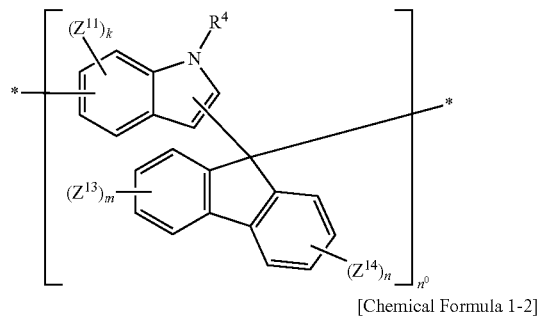

[Chemical Formula 1-2]

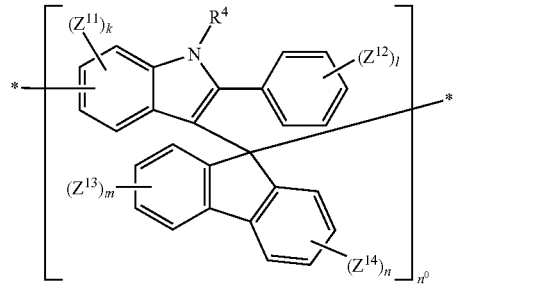

[Chemical Formula 1-3]

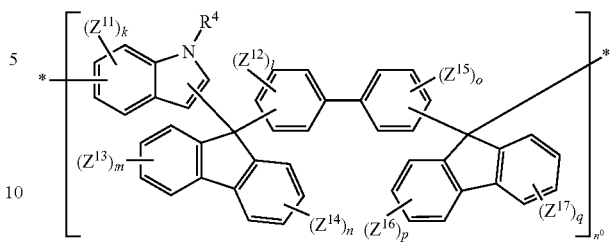

wherein, in Chemical Formulae 1-1 to 1-3, $R^4$ is hydrogen, a hydroxy group, a halogen, a substituted or unsubstituted C6 to C30 aryl group, or a combination thereof, $Z^{11}$ to $Z^{17}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, and q are each independently an integer of 0 to 2, $n^0$ is an integer of 2 to 300, and

* is a linking point.

11. The organic layer composition as claimed in claim 1, wherein the monomer represented by Chemical Formula 2 is represented by one of the following Chemical Formulae 2-1 to 2-7:

[Chemical Formula 2-1]

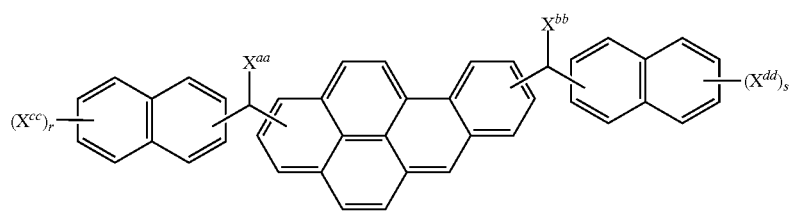

[Chemical Formula 2-2]

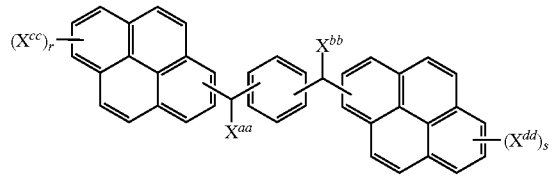

[Chemical Formula 2-3]

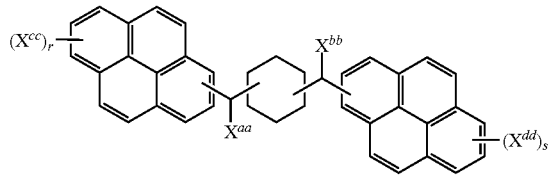

[Chemical Formula 2-4]

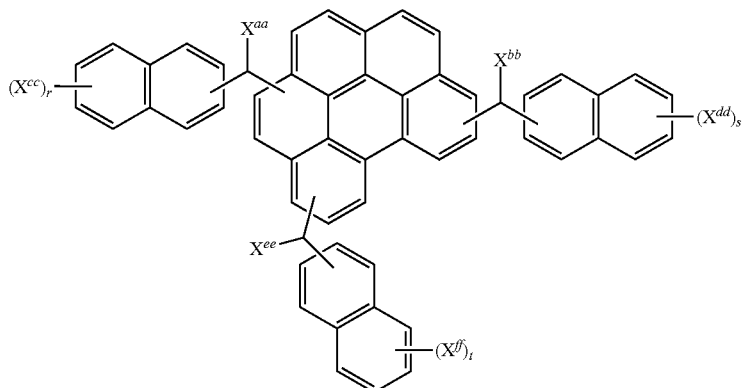

[Chemical Formula 2-5]

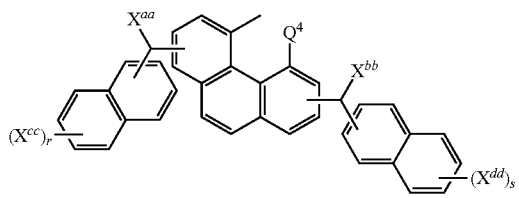

[Chemical Formula 2-6]

[Chemical Formula 2-7]

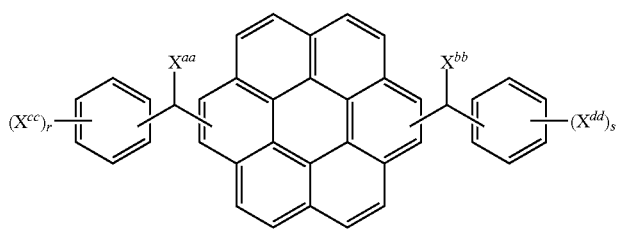

wherein, in Chemical Formulae 2-1 to 2-7, $X^{aa}$ to $X^{ff}$ are each independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, r, s, and t are each independently an integer of 0 to 2, and $Q^4$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, in which $R^a$ is hydrogen, a substituted or unsubstituted C1 to C10 alkyl group, a halogen atom, a halogen-containing group, or a combination thereof.

12. The organic layer composition as claimed in claim 1, wherein the polymer has weight average molecular weight of about 1,000 to about 200,000.

13. The organic layer composition as claimed in claim 1, wherein the monomer has a molecular weight of about 200 to about 5,000.

14. The organic layer composition as claimed in claim 1, wherein the polymer and the monomer are included in the composition in a weight ratio of about 9:1 to about 1:9.

15. The organic layer composition as claimed in claim 1, wherein the polymer and the monomer are included in the composition in an amount of about 0.1 to about 50 wt %, based on a total weight of the organic layer composition.

16. An organic layer obtained by curing the organic layer composition as claimed in claim 1.

17. The organic layer as claimed in claim 16, wherein the organic layer includes a hardmask layer.

18. A method of forming patterns, the method comprising:
providing a material layer on a substrate,
applying the organic layer composition as claimed in claim 1 on the material layer,
heat-treating the organic layer composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

19. The method as claimed in claim 18, wherein the organic layer composition is applied using a spin-on coating method.

20. The method as claimed in claim 18, further comprising forming a bottom antireflective coating before forming the photoresist layer.